United States Patent
Livesay et al.

(10) Patent No.: US 7,331,691 B2
(45) Date of Patent: Feb. 19, 2008

(54) LIGHT EMITTING DIODE LIGHT SOURCE WITH HEAT TRANSFER MEANS

(75) Inventors: William R. Livesay, San Diego, CA (US); Kari W. Beeson, Princeton, NJ (US); Scott M. Zimmerman, Baskin Ridge, NJ (US); Chad R. Livesay, Encinitas, CA (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 185 days.

(21) Appl. No.: 10/977,923

(22) Filed: Oct. 29, 2004

(65) Prior Publication Data

US 2006/0092639 A1 May 4, 2006

(51) Int. Cl.
*F21V 29/00* (2006.01)
(52) U.S. Cl. .................. 362/294; 362/373; 362/249
(58) Field of Classification Search .............. 362/294, 362/373, 249
See application file for complete search history.

(56) References Cited

U.S. PATENT DOCUMENTS

| | | | | |
|---|---|---|---|---|
| 4,729,076 A | * | 3/1988 | Masami et al. ............. | 362/235 |
| 4,992,704 A | * | 2/1991 | Stinson ...................... | 315/312 |
| 5,008,788 A | * | 4/1991 | Palinkas .................... | 362/231 |
| 5,119,174 A | * | 6/1992 | Chen .......................... | 257/98 |
| 5,255,171 A | * | 10/1993 | Clark .......................... | 362/231 |
| 5,410,454 A | | 4/1995 | Murase et al. | |
| 5,477,436 A | * | 12/1995 | Bertling et al. ............. | 362/545 |
| 5,528,474 A | * | 6/1996 | Roney et al. ................ | 362/294 |
| 5,857,767 A | * | 1/1999 | Hochstein ................... | 362/373 |
| 6,144,536 A | | 11/2000 | Zimmerman et al. | |
| 6,185,357 B1 | | 2/2001 | Zou et al. | |
| 6,186,649 B1 | | 2/2001 | Zou et al. | |
| 6,234,648 B1 | * | 5/2001 | Borner et al. ............... | 362/545 |
| 6,350,041 B1 | * | 2/2002 | Tarsa et al. ................. | 362/231 |
| 6,550,942 B1 | | 4/2003 | Zou et al. | |
| 6,682,211 B2 | * | 1/2004 | English et al. .............. | 362/294 |
| 6,692,251 B1 | * | 2/2004 | Logan et al. ................ | 433/29 |
| 6,910,794 B2 | * | 6/2005 | Rice ............................ | 362/547 |
| 7,095,110 B2 | * | 8/2006 | Arik et al. ................... | 257/712 |
| 7,095,187 B2 | * | 8/2006 | Young ........................ | 315/360 |
| 2002/0167807 A1 | * | 11/2002 | Wu .............................. | 362/294 |
| 2003/0002282 A1 | * | 1/2003 | Swaris et al. ............... | 362/249 |
| 2003/0072153 A1 | * | 4/2003 | Matsui et al. ............... | 362/294 |
| 2003/0227774 A1 | * | 12/2003 | Martin et al. ............... | 362/240 |
| 2004/0169451 A1 | * | 9/2004 | Oishi et al. .................. | 313/45 |
| 2005/0055070 A1 | * | 3/2005 | Jones et al. .................. | 607/88 |
| 2005/0196720 A1 | * | 9/2005 | Ostler et al. ................. | 433/29 |
| 2005/0243539 A1 | * | 11/2005 | Evans et al. ................. | 362/84 |
| 2006/0001384 A1 | * | 1/2006 | Tain et al. ................... | 315/246 |
| 2006/0005947 A1 | * | 1/2006 | Arik et al. ............. | 165/104.21 |
| 2006/0044804 A1 | * | 3/2006 | Ono et al. ................... | 362/294 |

* cited by examiner

*Primary Examiner*—Jong-Suk (James) Lee
*Assistant Examiner*—Ismael Negron
(74) *Attorney, Agent, or Firm*—William Propp, Esq.

(57) ABSTRACT

High brightness LEDs are mounted directly on a heat pipe or are mounted on a substrate, which is mounted on the heat pipe. The heat pipe can be a common electrode for the LEDs mounted on the heat pipe. Multiple heat pipes can be arranged so that the LED arrays form a light recycling cavity to emit and reflect light.

7 Claims, 14 Drawing Sheets

HIGH BRIGHTNESS LIGHT EMITTING DIODE LIGHT SOURCE

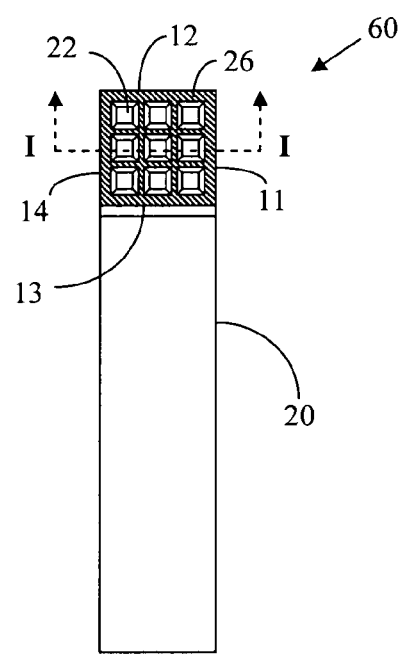
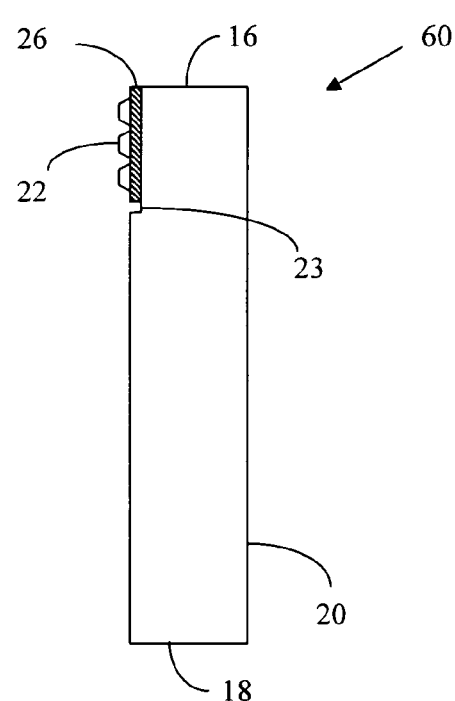
FIG. 2A
FIG. 2B
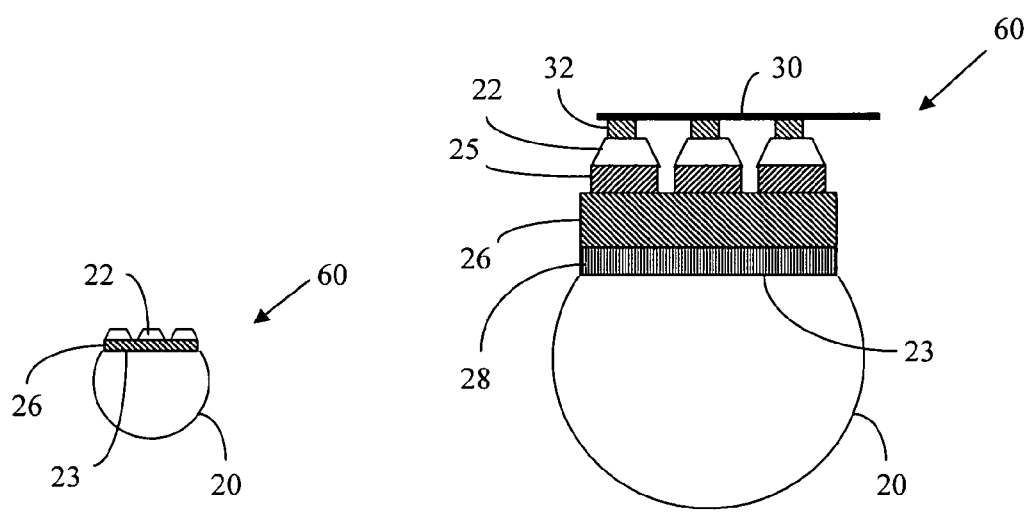
FIG. 2C
FIG. 2D

HIGH BRIGHTNESS LIGHT EMITTING DIODE LIGHT SOURCE

HIGH BRIGHTNESS LIGHT EMITTING DIODE LIGHT SOURCE

HIGH BRIGHTNESS LIGHT EMITTING DIODE LIGHT SOURCE

HIGH BRIGHTNESS LIGHT EMITTING DIODE LIGHT SOURCE

HIGH BRIGHTNESS LIGHT EMITTING DIODE LIGHT SOURCE

LIGHT EMITTING DIODE LIGHT SOURCE WITH HEAT TRANSFER MEANS

TECHNICAL FIELD

This invention relates to illumination systems and optical systems incorporating illumination systems, including projection displays, flat-panel displays, avionics displays, automotive lighting, residential lighting, commercial lighting, industrial lighting, and the like.

BACKGROUND OF THE INVENTION

Light emitting diodes (LEDs) have many advantages over incandescent, arc lamp and fluorescent light sources. Typically light emitting diodes produce less heat and in many applications can be more efficient than other types of light sources.

However, light emitting diodes have historically only been useful in low level lighting applications, e.g. indicator lamps, displays, and indoor signage.

The advent, however, of higher brightness LEDs have ushered in new applications where LEDs have been used in flashlights, traffic signal lights, outdoor signage, automobile headlights, and backlighting for flat panel displays. However, even with these higher brightness LED sources the luminance or brightness of the LEDs (lumens/unit area/unit solid angle) has not been sufficient to enable application of LEDs for high brightness sources used in projection displays and collimated light sources.

Current projection displays utilize high pressure arc lamp sources, which pose a safety hazard and also are short lived (500 to 5,000 hours). In contrast, LED light sources operate at low voltage, low pressure and are extremely long lived (up to 50,000 hours).

However, one problem with high brightness LEDs is dissipation of heat. Incandescent and arc lamp light sources dissipate most of their heat through infrared radiation. LEDs must dissipate their heat through thermal conduction. Therefore conventional LED light sources have utilized mounting configurations wherein adjacent LEDs cannot be too closely spaced in order to spread the heat dissipation over a larger area of the heat sink.

In fact, one of the primary limitations of creating even higher brightness LED light sources is the difficulty in dissipating the heat from the small area LED. LED brightness is directly related to the forward current through the light emitting PN junction. Higher currents produce higher lumen output and therefore higher brightness. However, higher current levels produce higher thermal loads and raise the temperature of the PN junction. Lumen output (brightness) is inversely proportional to the junction temperature.

Therefore, the present limit to driving an LED is determined by the ability to dissipate the heat generated by the LED. Therefore, a need exists to dissipate heat out of LEDs at higher rates than currently available. If a means of higher heat dissipation allows closer packing of the LEDs while driving them at higher current levels, a light source may be constructed that meets the brightness level requirements of projection displays, collimated light sources, and other applications currently being filled by high pressure arc lamp sources.

In a co-pending patent application, U.S. patent application Ser. No. 10/445,136, commonly assigned as the present application and herein incorporated by reference, a method is shown to achieve a high intensity light source by using LEDs in a light recycling cavity to achieve higher output luminance or radiance than could be achieved by a single LED. As described in U.S. patent application Ser. No. 10/445,136, the interior of the light recycling cavity is kept small such that the input light sources comprise a high percentage of the interior of the light recycling cavity. In practice, this requires a high packing density of LEDs. This, therefore, requires a means of dissipating the heat from these recycling light cavities.

Accordingly, it is the object of this invention to provide a means of dissipating heat from LEDs and configuring them in a highly dense packed array such as to provide a very high brightness light source that will rival that of high pressure arc lamps.

It is another objective of this invention that the LEDs are arranged in a configuration such that the output luminance of the light source is higher than the output luminance of any one of the LEDs making up the light source It is another objective of this invention to create an LED based light source, which is a drop-in replacement for high pressure light sources used in projection displays. Example displays include digital-light-processor (DLP) displays, liquid-crystal displays (LCDs) and liquid-crystal-on-silicon (LCOS) displays.

SUMMARY OF THE INVENTION

In one embodiment of the invention, high brightness LEDs are mounted directly onto at least one heat pipe. To form a bond of high thermal conductivity between the LED and the heat pipe, the LEDs are eutectically soldered directly to the heat pipe.

Alternatively, the LEDs are first eutectically soldered to a thin (25-125 micrometers) highly reflective, highly thermally conductive substrate (e.g. silver, aluminum, etc.) and then this substrate is soldered to the heat pipe. This allows a high temperature eutectic solder bond to the silver and a lower temperature solder bond to the heat pipe. In most LED mounting schemes, an insulating material is used between the LED and the heatsink to electrically isolate the heatsink from the drive circuitry of the LED. However, very few electrically isolating bonding materials are available that have thermal conductivities on a par with metal alloys.

In the disclosed invention with a metallic attachment of the LED to the heat pipe, the heat pipe becomes an electrode of the high intensity light source. This, therefore, requires that the heat pipe is electrically isolated at the heat dissipating end of the heat pipe. However, this can be readily accomplished using an array of cooling fins and air cooling thereby electrically isolating (via air) the heat pipe.

In another embodiment of this invention, multiples of LEDs and heat pipes are arranged to form a cubical, rectangular, pyramidal or tapered light recycling cavity that has an output aperture. Multiple LEDs are arranged within a light recycling cavity such that a high percentage of the interior of the cavity is covered with LEDs. If the area of the output aperture is less than the total emitting area of LEDs within the light recycling cavity, under some conditions there will be a net gain in the output luminance of the cavity over that of an individual LED. This makes for a highly efficient and economical light source such as might be used in projection or other high intensity light sources.

Another embodiment of this invention is an illumination system consisting of a light recycling cavity wherein the cavity is formed by multi-colored LEDs mounted directly to heat pipes. The resulting illumination system produces a higher brightness and higher total flux than any one of the individual LEDs making up the light source. The light source can emit white light or the light source can emit light in which the colors can be continuously varied light that can change colors.

Another embodiment of this invention is an illumination system comprising an array of LEDs mounted on a heat pipe, a light collimating means and a polarizing means. This embodiment can be used for display applications.

BRIEF DESCRIPTION OF DRAWINGS

FIG. 1 shows one embodiment of the invention, an array of light emitting diodes mounted directly to a heat pipe assembly.

FIG. 2 depicts an alternative arrangement of mounting LEDs directly to a heat pipe. FIG. 2A is a top view of the LED die mounted directly to a thin metal substrate which in turn is directly mounted to a heat pipe. FIG. 2B is a side view of the LED die mounted directly to the thin metal substrate which in turn is directly mounted to a heat pipe. FIG. 2C shows a cross-sectional view along the I-I plane indicated in FIG. 2A of the LED die, the thin metal substrate and the heat pipe. FIG. 2D shows a magnified cross-sectional view along the I-I plane of the LED die depicting the solder connections between the LED die and the thin metal substrate and the solder connection between the thin metal substrate and the flat portion of the heat pipe.

FIG. 3 shows two heat pipes with an array of LEDs mounted to each of them and arranged to form a tapered light recycling cavity.

FIG. 5 shows two heat pipes with an array of LEDs mounted to each of them and arranged to form a light recycling cavity.

FIG. 6 shows four heat pipes with LEDs mounted directly to a beveled end of the heat pipe and the heat pipes arranged to form a light recycling cavity.

FIG. 7 shows another method of forming a cubical light recycling cavity with LEDs mounted on sides of the heat pipe.

DETAILED DESCRIPTION OF THE INVENTION

Figure 1A:
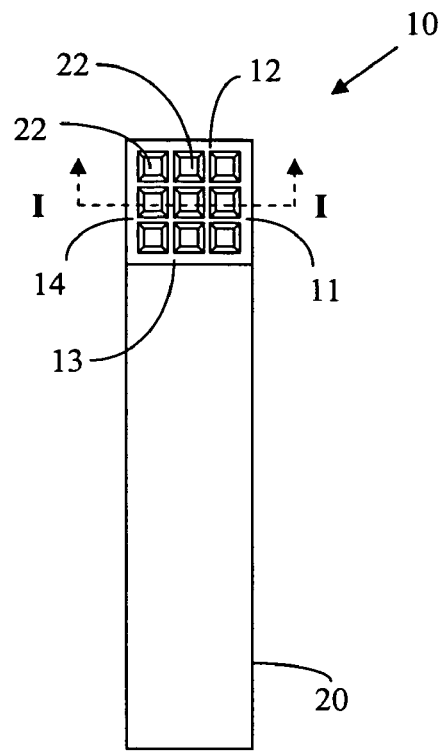
FIG. 1A shows a top view of the LED die mounted directly to the heat pipe.

The invention consists of one or more high brightness LEDs bonded to a heat pipe, a liquid based cooling device or a thermal conducting means. Multiple heat pipes can be arranged such that the corresponding multiple LEDs form a light recycling cavity for enhancing the output luminance of the LEDs.

LEDs can be highly reflective to their own emitted light due to the isolation created by the electrical to optical conversion process. Unlike black-body incandescent and arc lamp sources that are poor reflectors of incident light, LEDs and some phosphor based sources can exhibit low absorption to reflected photons. It thus becomes possible to enhance the output luminance of these devices if a high efficiency light recycling cavity can be created.

Absorption and reflectivity losses must be minimized in order for a light recycling cavity to work effectively. One aspect of minimizing these losses is to make the cavity as small as possible. Unfortunately this runs counter to the thermal needs of the multiple LEDS in the light recycling cavity. This invention provides methods and apparatus, which allow the fabrication of extremely compact, light recycling cavities with efficient thermal cooling.

FIG. 1 shows one embodiment of the invention wherein a high intensity light source 10 has a high packing density of LEDs 22 integrally bonded to a heat pipe 20. The LEDs 22 in FIG. 1A may all have the same output color or the LEDs 22 may separately emit different colors. If the array of LEDs 22 contains red and green LEDs, then the array of LEDs may emit yellow light when operated in combination. If the array of LEDs 22 contains green and blue LEDs, then the array of LEDs may emit cyan light when operated in combination. If the array of LEDs 22 contains red and blue LEDs, then the array of LEDs may emit magenta light when operated in combination. Finally, if the array of LEDs 22 contains red, green and blue LEDs, then the array of LEDs 22 may emit white light when operated in combination.

The heat pipe 20 is a closed cylindrical cavity with a recirculating fluid and vapor mixture to remove heat from the LEDs 22 and transfer the heat along the heat pipe to a dissipating means in order to dissipate the heat. The heat dissipation means can be exposing one end of the heat pipe to ambient atmosphere, or a passive or active heat sink, or passive or active transfer of the heat to a second fluid. The heat generated by the LEDs vaporizes the fluid inside the heat pipe 20 adjacent to the LEDs. The vapor 58 travels to the heat dissipating end of the heat pipe and condenses back to a fluid. The fluid 56 travels to the LED end of the heat pipe via a wick 52 that extends along the entire length of the inside of the heat pipe 20.

The heat pipe is typically cylindrical to maximize heat flow for the circulating fluid. The heat pipe can have other shapes based on the positioning of the LEDs of the high intensity light source within an optical system, the location of the heat dissipating means and the positioning and location of other elements adjacent to the LEDs. For example, the cross sectional shape of the heat pipe may be a circle, an ellipse, a square, a rectangle or a polygon. The heat pipe can be straight or the heat pipe can be bent. If the heat pipe is bent, the bend must not restrict the flow of fluid and vapor inside the heat pipe. The high intensity light source of this invention may have to fit a pre-existing shape and size if it is to serve as a replacement for an incandescent or fluorescent light source.

The fluid 56 and vapor 58 can circulate between the LEDs and the heat dissipation means within the heat pipe based on normal heat flow. Alternately, additional mechanical, electrical or fluid means can be provided within the heat cavity to circulate the fluid between the LEDs and the heat dissipation means.

The heat pipe 50, as described herein, is a closed cavity with a cooling fluid (typically water and alcohol or a mix thereof) and an internal wick 52, which provides a recirculating path for the cooling fluid 56 and vapor 58 to transport from one end of the heat pipe to the other end of the heat pipe. Heat pipes are well known in the art and are commercially available from companies such as Dynatron and Thermacore.

Figure 1B:
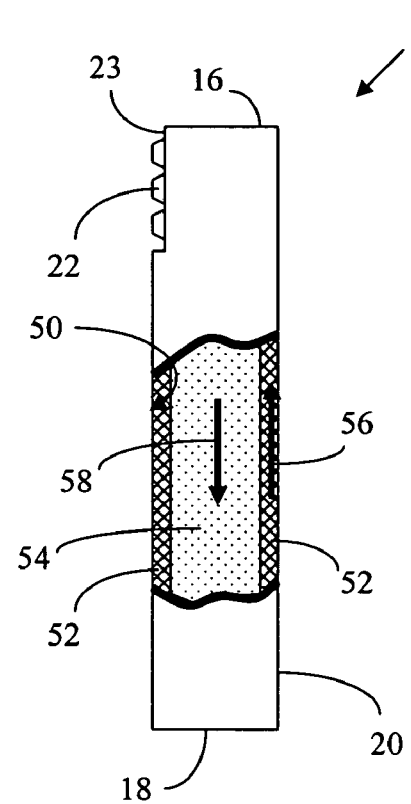
FIG. 1B shows a side view of the LED die mounted directly to the heat pipe and includes a cutout view of the interior of the heat pipe.
Figure 1C:
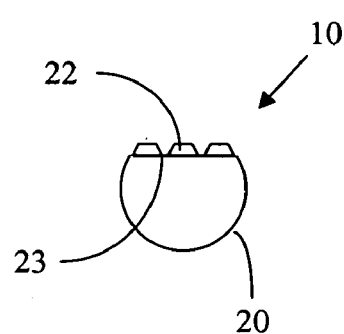
FIG. 1C is cross-sectional view along the I-I plane indicated in FIG. 1A.

Shown in FIG. 1A and 1B is a 3×3 array of LEDs 22 bonded directly to the heat pipe 20. The 3×3 array of LEDs is merely an illustrative example. The number of LEDs 22 on the heat pipe 20 can be one or more. If more than one, the multiple LEDs 22 can be arranged in a high density pattern. The pattern will typically be a geometric pattern.

The array of LEDs 22 has a first side 11, a second side 12, a third side 13, and a fourth side 14. The first side 11 is opposite the fourth side 14 and both the first side 11 and fourth side 14 are parallel to the length of the cylindrical heat pipe. The second side 12 is opposite the third side 13 and both the second side 12 and third side 13 are perpendicular to the first and fourth side, perpendicular to the length of the cylindrical heat pipe, and parallel to the width of the cylindrical heat pipe.

The heat pipe has a first end 16 and a second end 18. The first end 16 of the heat pipe is closest to the array of LEDs 22 and the second side 12 of the array of LEDs 22 is closest to the first end 16 of the heat pipe. The second end 18 of the heat pipe with the heat dissipation means (not shown in this Figure) is farthest away from the array of LEDs 22 and the third side 13 of the array of LEDs is closest to the second end 18 of the heat pipe.

To achieve good thermal contact the heat pipe is flattened 23 (see FIGS. 1B and 1C) on one cylindrical side of the heat pipe 20 near the first end 16 in order to form a large area contact to each LED. The flat surface 23 on the cylindrical heat pipe 20 also provides a better bonding surface for the LEDs. The flat surface 23 provides for light emission from the individual LEDs 22 in the same direction along the same axis. The flat surface 23 also provides for a better alignment of the heat pipes so that the flat surfaces and corresponding LEDs can form a light recycling cavity. Alternately, not shown in these Figures, the LED array 22 can be bonded to the flat surface at the first end 16 of the heat pipe 20.

The LEDs 22 in the array are reflective to external light generated by other light sources or other arrays of LEDs. The flat surface 23 is reflective to light emitted by the array of LEDs 22 and reflective to light generated external to the LED array.

Heat will be generated by the LEDs during emission of light from the LEDs. Heat will flow from the base of the LEDs to the flat surface of the heat pipe through the side of the heat pipe to the fluid within the heat pipe. The heat will raise the temperature of the fluid within the heat pipe causing the fluid to vaporize. The vapor 58 will travel to a dissipating means at another position on the heat pipe, away from the array of LEDs on the flat surface. The dissipating means will dissipate the heat from the vapor in the heat pipe and cause the vapor to condense into fluid. The fluid 56 will flow along the wick back to the base of the LEDs.

The flat surface 23 of the heat pipe must be a thermal conductor. The remainder of the heat pipe 20 may be a thermal conductor. Unless the heat pipe is being used as part of the electrical circuit to power the LEDs, the heat pipe need not be an electrical conductor.

Figure 1D:
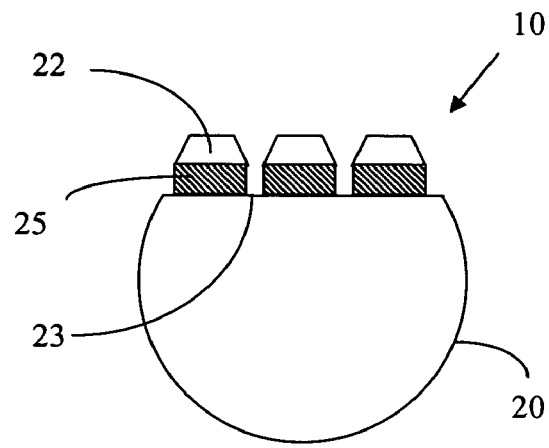
FIG. 1D is a magnified cross-sectional along the I-I plane of the LED die mounted directly to the heat pipe.

In FIG. 1D, the LEDs 22 are shown soldered directly to the heat pipe 20. The solder 25 (not shown to scale) is typically very thin (0.01 mm to 2 mm thick) providing a very high thermal conductivity to the heat pipe. Due to constraints on the maximum temperature of the heat pipe, a low temperature solder (135°-150° C.) such as bismuth-tin is used to attach the die to the heat pipe. The low temperature solder avoids excessive high internal pressures being generated within the enclosed heat pipe by a high temperature during the soldering operation.

Even though a low temperature solder is preferable for bonding the LEDs to the heat pipe, the melting point of the solder is greater than the temperature of any possible heat flow from the LEDs to the heat pipe and greater than any possible ambient temperature of the operating environment of the high intensity light source of the invention.

Heat will be generated by the LEDs 22 during emission of light from the LEDs. Heat will flow from the base of the LEDs through the solder to the flat surface of the heat pipe through the side of the heat pipe to the fluid within the heat pipe. The heat will raise the temperature of the fluid within the heat pipe, causing the fluid to vaporize. The heated vapor will circulate within the heat pipe to a dissipating means at another position on the heat pipe, away from the array of LEDs on the flat surface. The dissipating means will dissipate the heat from the vapor in the heat pipe, causing the vapor to condense back to a fluid. The fluid will flow along the wick back to the base of the LEDs.

The solder 25 of the heat pipe must be a thermal conductor. Unless the heat pipe is being used as part of the electrical circuit to power the LEDs, the solder need not be an electrical conductor.

By mounting the die directly to the heat pipe, the LEDs can be arranged in a higher packing density than if they were mounted on an intermediate leadframe or low thermal conductivity substrate, which was then mounted on the heat pipe.

In a preferred embodiment of this invention, illustrated in FIGS. 2A, 2B, 2C and 2D, an array of LEDs 22 of light source 60 are first mounted to a thin metal substrate 26 using a high temperature eutectic bond as known in the art. The thin metal substrate 26 (silver, aluminum, etc.) serves as a thermal and electrical conductor and as a reflector for any externally generated light that may not reflect off the internal reflector of the LEDs.

Shown in FIG. 2D, a high temperature solder 25 (285° C.-320° C.), such as 80% Au 20% Sn, is used to attach the LEDs 22 to the thin metal substrate 26 (silver, aluminum, etc.). Once the LEDs are soldered to the thin metal substrate, the substrate 26 is then soldered directly to the flat surface 23 of the heat pipe using a low temperature (135° C.-150° C.) solder 28 (e.g. bismuth tin). This keeps the LEDs attached to the substrate (as it is below the temperature of the solder bond between the LEDs and the thin metal substrate) and permits fabrication using automated pick and place equipment. The low temperature solder avoids excessive high internal pressures being generated within the enclosed heat pipe by a high temperature during the soldering operation.

The top electrode contact is made via bonding wire 30 to the metal contact 32 at the top of the die. To minimize the number of wires, ganged bonding can be used to connect multiple LEDs with one wire 30. Silver (or tinned copper) wire 30 is preferred for these contacts since silver or tinned copper is highly reflective. The wire 30 is internal to the light recycling cavity and low reflectivity surfaces are to be avoided.

The bottom electrode can be the thin metal substrate 26 or the heat pipe 20. If the heat pipe 20 is the bottom electrode, both the low temperature solder 28 and the heat pipe 20 must be electrically conductive.

In this embodiment, all the LEDs are connected in parallel. It is also within the scope of this invention that some or all of the LEDs may be connected in series.

Wire bonding or solder techniques, as known in the art, are used to mount a silver or highly reflective wire 30 onto the top of the LED. Alternatively, a solder bond 32 may be used to attach the top wire to each LED die. The solder bond 32 can be a high temperature solder if the bases of the LEDs and the thin metal substrate 26 are held at a low temperature while the wire bonding takes place.

Care is taken to cover any non-reflective surface of the die such as a gold contact with a reflective material. Any uncovered non-reflective surface will reduce the efficiency in the light recycling cavity due to absorption of recycled light. This is not a concern in conventional LEDs because the light emitted from the LED is not recycled back to the LED. Within a light recycling cavity, however, all these losses must be minimized for maximum efficiency.

Figure 3A:
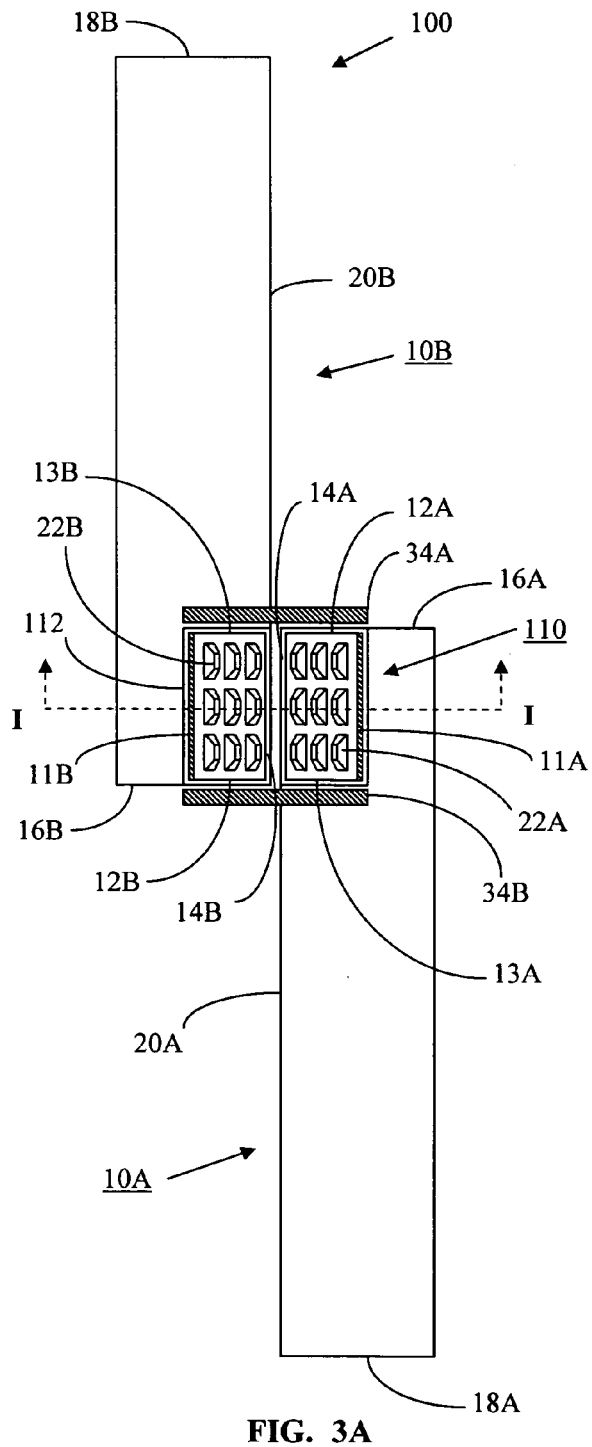
FIG. 3A shows the heat pipes arranged such that the two heat dissipating ends of the heat pipes are pointing away from each other.
Figure 3B:
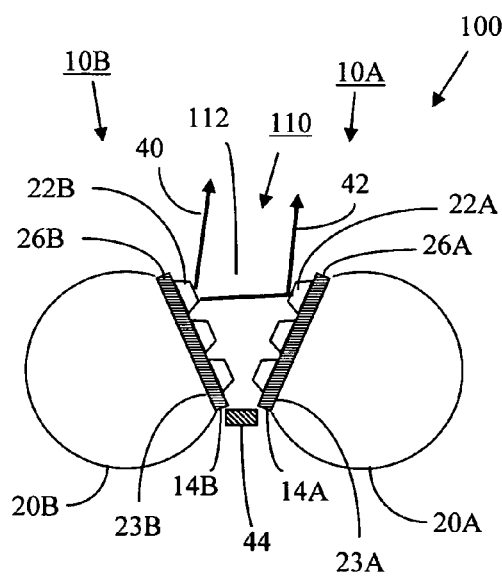
FIG. 3B shows a cross-sectional view along the I-I plane indicated in FIG. 3A of the light recycling cavity created by the two heat pipes.
Figure 3C:
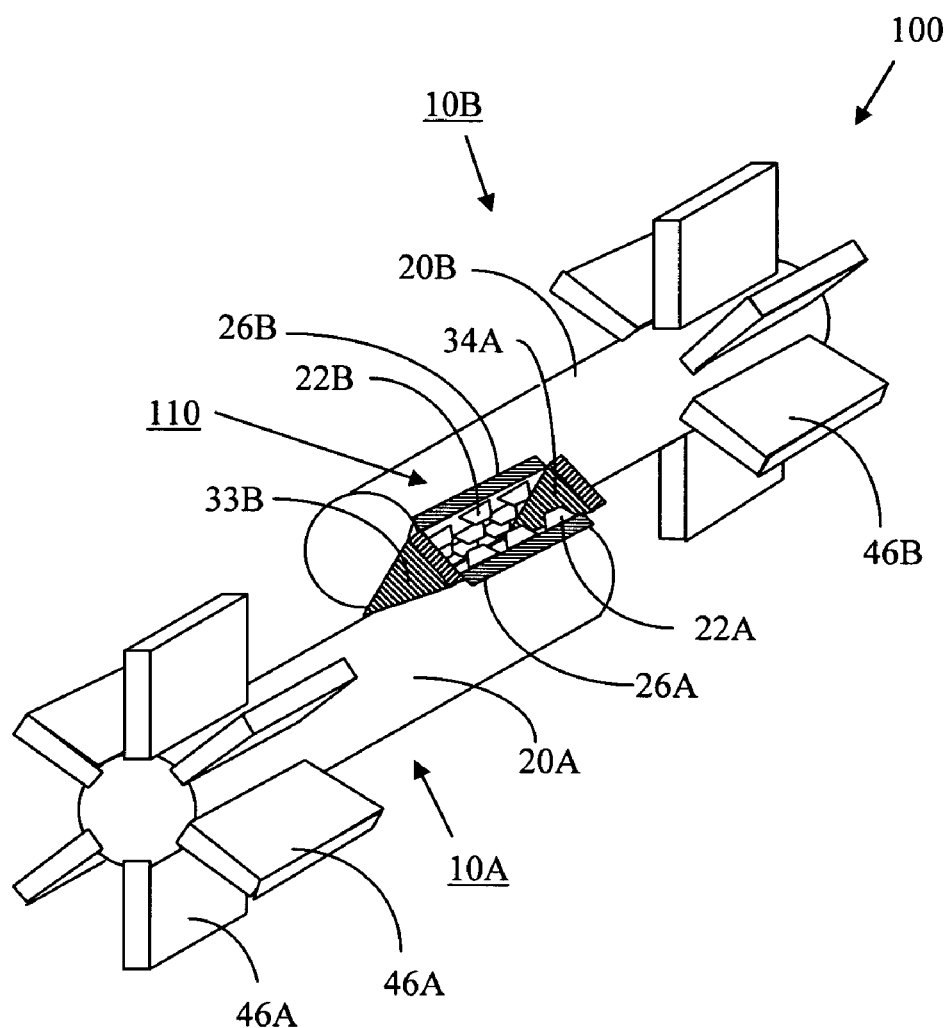
FIG. 3C shows the recycling light cavity formed by the LEDs mounted to the heat pipe and cooling fins on the heat dissipating ends of the heat pipes.

A preferred embodiment of this invention, shown in FIGS. 3A, 3B, 3C and 3D, involves the formation of a light recycling cavity between two heat pipes. FIG. 3A is a top view of illumination system 100. FIG. 3B is a cross-sectional view along the I-I plane indicated in FIG. 3A. FIG. 3C is a perspective view showing the addition of cooling fins. FIG. 3C is an enlarged view of the light recycling cavity.

FIG. 3A shows an illumination system 100 having a light recycling cavity 110 formed using two high intensity light sources, high intensity light source 10A and high intensity light source 10B, and additional reflective elements 34A, 34B and 44 to complete the cavity. High intensity light source 10A is comprised of heat pipe 20A, thin metal substrate 26A and an array of LEDs 22A. High intensity light source 10B is comprised of heat pipe 20B, thin metal substrate 26B and an array of LEDs 22B. The high intensity light sources 10A and 10B are arranged with the heat dissipating ends extending in opposite directions. An array of LEDs 22A is bonded to a thin metal substrate 26A. Thin metal substrate 26A is bonded to flat surface 23A of heat pipe 20A. An array of LEDs 22B is bonded to a thin metal substrate 26B. Thin metal substrate 26B is bonded to flat surface 23B of heat pipe 20B. Preferably thin metal substrates 26A and 26B are constructed from reflective metals such as silver or aluminum. A low temperature solder (for example bismuth tin) is used to attach the thin metal substrates to the heat pipes.

The LEDs 22A and 22B in FIGS. 3A, 3B, 3C and 3D may all be identical and all emit the same output color or the LEDs 22A and 22B may not all be identical and may emit two or more colors, either simultaneously or separately in time. As an illustrative example, LEDs 22A may all emit blue light and LEDs 22B may all emit green light. The array of LEDs 22A may be powered to emit blue light when the array of LEDs 22B is not powered. Conversely, the array of LEDs 22B may be powered to emit green light when the array of LEDs 22A is not powered. If both arrays are powered simultaneously, a composite color, such as cyan light, will be emitted by the illumination system 100. If the array of LEDs 22A and the array of LEDs 22B contain red, green and blue LEDs in the proper proportions, then illumination system 100 may emit white light when all the LEDs are operated simultaneously.

The heat dissipations means of cooling fins 46A and 46B are bonded, respectively, to the heat pipes 20A and 20B by a low temperature solder (for example bismuth tin). The array of LEDs 22A on the flat surface 23A are at the first end 16A of the heat pipe 20A while the cooling fins 46A are at the second end 18A of the heat pipe. The array of LEDs 22B on the flat surface 23B are at the first end 16B of the heat pipe 20B while the cooling fins 46B are at the second end 18B of the heat pipe.

In FIG. 3C, the plane of each heat fin 46A is parallel to the long axis of high intensity light source 10A. The plane of each heat fin 46B is parallel to the long axis of high intensity light source 10B. This orientation of the heat fins is not a requirement. The plane of each fin may also be oriented perpendicular to the long axis of the respective high intensity light source or the plane of each heat fin may be oriented at some other angle from 0 degrees to 90 degrees with respect to the long axis of the respective high intensity light source.

The fourth side 14A of the array of LEDs 22A on the flat surface 23A of the first heat pipe 20A is positioned adjacent to the fourth side 14B of the array of LEDs 22B on the flat surface 23B of the second heat pipe 20B.

According in FIG. 3C, the cooling fins 46A of the first heat pipe 20A is at the opposite end of the illumination system and at the maximum distance from the cooling fins 46B of the second heat pipe 20B. This arrangement maximizes the air cooling of the two heat pipes of the illumination system.

The array of LEDs 22A on the flat surface 23A of the first heat pipe 20A is angled relative to the array of LEDs on the flat surface 23B of the second heat pipe 20B. The two array of LEDs form a V-shaped tapered light recycling cavity. Preferably the full angle of the taper is between about 5 degrees and 90 degrees. More preferably, the full angle of the taper is between about 10 degrees and 45 degrees If needed to complete reflecting surface of the light recycling cavity 110, a rectangular diffuse reflector 44, as best shown in FIG. 3B, is positioned parallel to and adjacent to the fourth side 14A of the array of LEDs 22A on the flat surface 23A of the first heat pipe 20A and the fourth side 14B of the array of LEDs on the flat surface 23B of the second heat pipe 20B. The diffuse reflector 44 will reflect any emitted light from the two arrays of LEDs into the light recycling cavity 110.

Figure 3D:
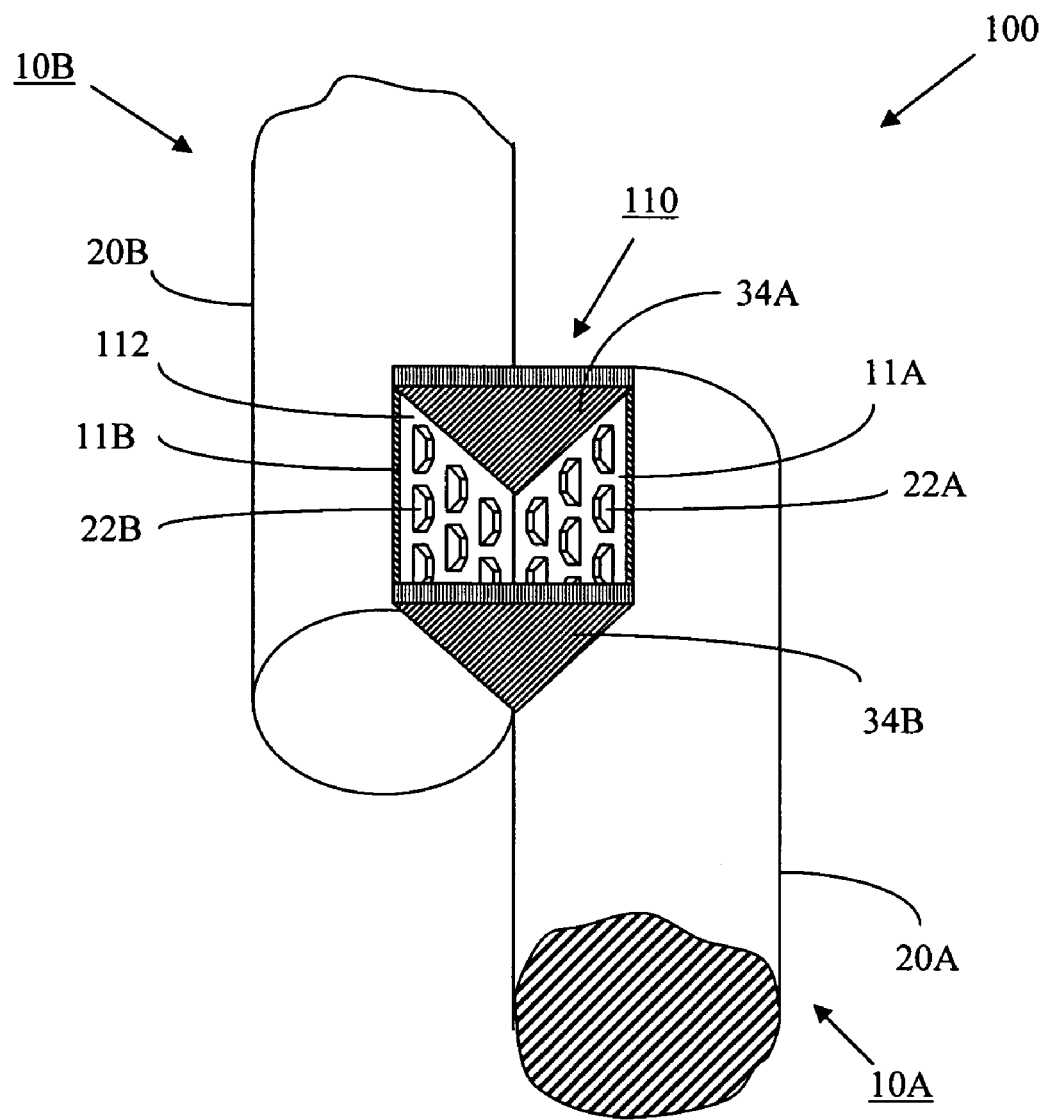
FIG. 3D is a magnified view of the tapered light recycling cavity.

As best shown in FIGS. 3A and 3D, a first tapered diffuse reflector 34A is positioned perpendicular to and adjacent to the second side 12A of the array of LEDs 22A of the first heat pipe 20A and positioned perpendicular to and adjacent to the third side 13B of the array of LEDs of the second heat pipe 20B. The first tapered diffuse reflector 34A is isosceles triangular in shape with a first side equal to a second side and with a third side, unequal to the first and second side and between the first and second side.

The first side of the first tapered diffuse reflector 34A is positioned perpendicular to and adjacent to the second side 12A of the array of LEDs 22A of the first heat pipe 20A. The second side of the first tapered diffuse reflector 34A is positioned perpendicular to and adjacent to the third side 13B of the array of LEDs 22B of the second heat pipe 20B.

The first tapered diffuse reflector 34A has a diffuse reflective surface facing the two arrays of LEDs and will reflect any emitted light from the two arrays of LEDs into the light recycling cavity.

A second tapered diffuse reflector 34B is positioned perpendicular to and adjacent to the third side 13A of the array of LEDs 22A of the first heat pipe 20A and positioned perpendicular to and adjacent to the second side 12B of the array of LEDs 22B of the second heat pipe 20B. The second tapered diffuse reflector 34B is isosceles triangular in shape with a first side equal to a second side and with a third side, unequal to the first and second side and between the first and second side.

The first side of the second tapered diffuse reflector 34B is positioned perpendicular to and adjacent to the third side 13A of the array of LEDs 22A of the first heat pipe 20A. The second side of the second tapered diffuse reflector 34B is positioned perpendicular to and adjacent to the second side 12B of the array of LEDs 22B of the second heat pipe 20B.

The second tapered diffuse reflector 34B has a diffuse reflective surface facing the two arrays of LEDs and will reflect any emitted light from the two arrays of LEDs into the light recycling cavity.

The tapered light recycling cavity of the illumination system 100 consists of the array of LEDs 22A of the first heat pipe 20A, the array of LEDs 22B of the second heat pipe 20B, the optional rectangular diffuse reflector 44, the first tapered diffuse reflector 34A and the second tapered diffuse reflector 34B.

The entire interior area of the light recycling cavity 110, excluding the emitting areas of the LEDs, and including the rectangular diffuse reflector 44 and the tapered diffuse reflectors 34A and 34B, is coated with a high reflective light diffusing material (such as Gore DRP®, Avian, Fluorofilm™, Spectralon, barium sulfate, or the like). Diffuse reflectors are preferred due to their high reflectance at all angles and non-conductive nature, but metallic and dielectric reflectors are also embodiments of this invention. The areas surrounding the LEDs can be coated before or after the full light recycling cavity is assembled, taking care not to cover the emitting surfaces of the LEDs.

The third side of the first diffuse reflector 34A, the first side of the array of LEDs 22A of the first heat pipe 20A, the third side of the second diffuse reflector 34B and the first side 11B of the array of LEDs 22B of the second heat pipe 20B form a light output aperture 112 for the emitted light from the arrays of LEDs and the reflected light from the arrays of LEDs and diffuse reflectors of the illumination system.

If a smaller light output aperture is desired without changing the full angle of the V-shaped light recycling cavity 110, an optional reflector (not shown) having a smaller light output aperture may be used to cover the opening formed by the third side of the first diffuse reflector 34A, the first side of the array of LEDs 22A of the first heat pipe 20A, the third side of the second diffuse reflector 34B and the first side 11B of the array of LEDs 22B of the second heat pipe 20B. A smaller light output aperture may be desirable to effectively couple the light output to other optical systems such as projection displays.

If the area of the light output aperture 112 of the light recycling cavity is less than the total emitting area of the array of LEDs 22A and the array of LEDs 22B, then it is possible for the light exiting the cavity to be brighter than an equivalent single LED measured in the absence of recycling. The brightness enhancement is described in U.S. patent application Ser. No. 10/445,136 and U.S. patent application Ser. No. 10/814,043, both of which are commonly assigned as the present application and herein incorporated by reference.

In order for brightness enhancement to occur, the LEDs and the inside surfaces of the light recycling cavity must be highly reflective. Preferably the reflectivity of both the inside surfaces of the light-recycling cavity and the LEDs is at least 50%. More preferably, the reflectivity of both the inside surfaces of the light-recycling cavity and the LEDs is at least 70%. Most preferably, the reflectivity of both the inside surfaces of the light-recycling cavity and the LEDs is at least 90%. Ideally, the reflectivity of the inside surfaces of the light recycling cavity and the reflectivity of the LEDs should both be as close to 100% as possible in order to maximize the efficiency and the maximum exiting brightness of the illumination system.

As shown in FIG. 3B, the LED 22B will emit a light beam 40 which exits the illumination system through the light output aperture 112. Alternately, the LED 22B will emit a light beam 42, which is reflected within the light recycling cavity, in this illustrative example off a LED 22A on the other heat pipe, and then exits the illumination system through the light output aperture 112. The emitted light beam can also reflect off the thin metal substrate under the array of LEDs on the other heat pipe, or reflect off the rectangular diffuse reflector 44, or reflect off the first tapered diffuse reflector 34A, or reflect off the second tapered diffuse reflector 34B, before the light beam exits the illumination system through the light output aperture. The emitted light beam can also reflect multiple times off different reflective surfaces within the light recycling cavity before the light beam exits the illumination system through the light output aperture.

The heat pipe assemblies can be joined adhesively using, for example, solder or epoxy or the heat pipe assemblies can be joined by mechanical means using, for example, metal clamps. In this particular embodiment, the heat pipes are mounted in opposing direction.

The light recycling cavity 110 of illumination system 100 has two arrays of LEDs, array of LEDs 22A and array of LEDs 22B. The array of LEDs 22A may be electrically powered independently of the array of LEDs 22B or the two arrays may be electrically powered simultaneously. When powered simultaneously, the two arrays may be connected to one power supply either in series or in parallel. An illustrative electrical connection diagram for a single array of LEDs is shown in FIG. 4.

Figure 4:
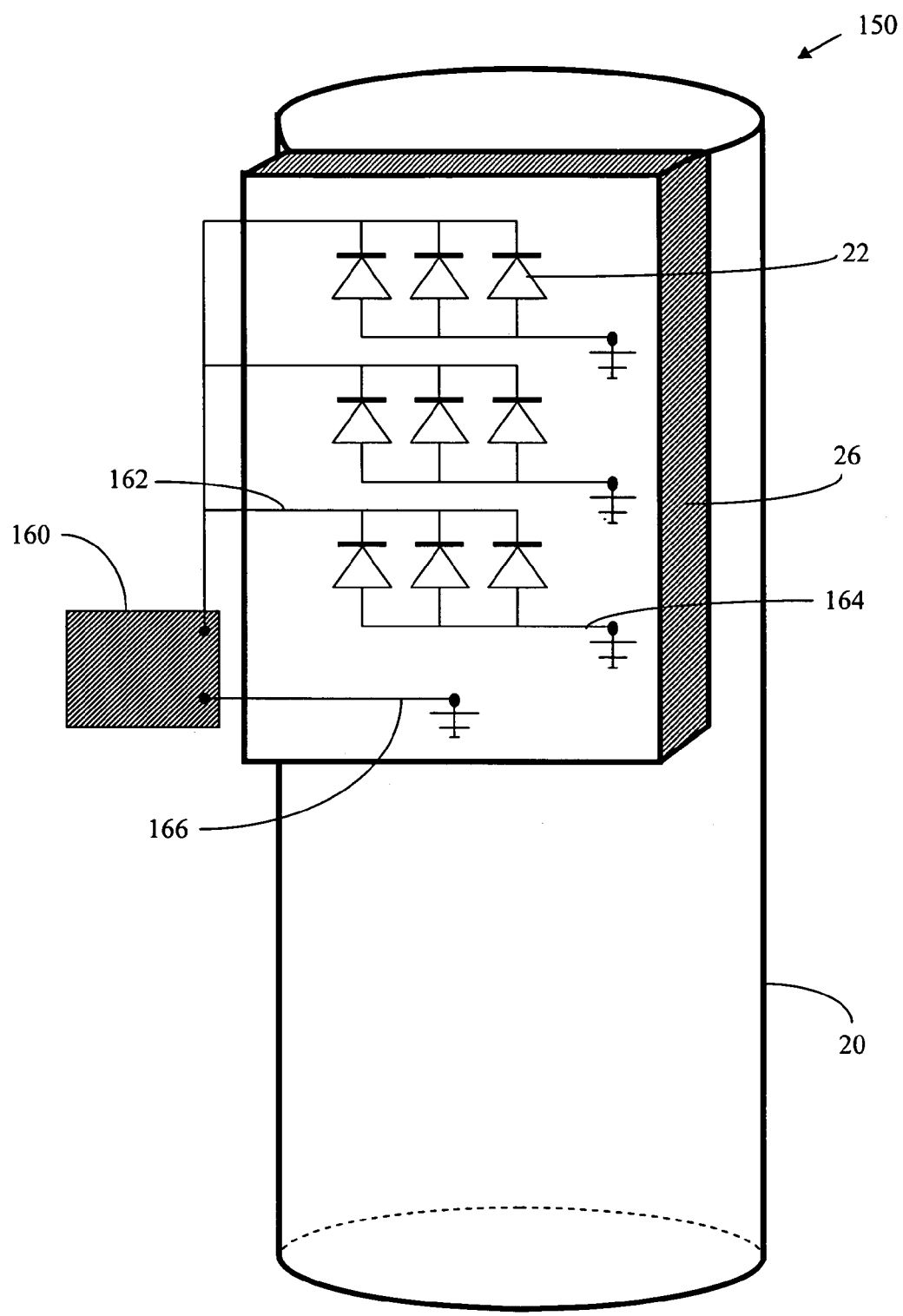
FIG. 4 is a schematic of the three-by-three array of LEDs being powered by a constant current power supply with the heat pipe as part of the ground electrode.

The electrical circuit for high intensity light source 10 is illustrated as high intensity light source 150 in FIG. 4.

The use of the heat pipe or thermal conduction means as an electrical input or output to a recycling cavity is an embodiment of this invention. The top electrical contact is made via the highly reflective wire to the top of the LEDs. The bottom contact is made directly to the heat pipe itself or through a thin metal substrate to the heat pipe. Since the LEDs are directly bonded to the heat pipe with high conductivity metal bonds as in FIG. 1 or the LEDs are bonded to a thin metal substrate and the thin metal substrate is bonded to the heat pipe with high conductivity metal bonds as in FIGS. 2, 3 and 4, the heat pipe serves a dual purpose as a thermal and electrical conductor.

Shown in FIG. 4 is a schematic of the electrical connections to the LED [light emitting] die 22 mounted on a thin metal substrate 26, which in turn is mounted to a heat pipe 20. In general, the bottom LED electrodes adjacent to the thin metal substrate can be either the positive electrodes or the negative electrodes of the LEDs depending on how the LEDs are fabricated. In FIG. 4, the bottom electrodes are assumed to be the positive electrodes and the top electrodes are the negative electrodes. The top electrodes are connected in parallel to the negative side of a suitable constant current power supply 160 (e.g. Advance Transformer—Xitanium LED 120A0024V33F) via wire connections 162. Larger transformers or multiple transformers may be used for large arrays of LEDs. The bottom positive electrode of each of the LED die (e.g. Cree Part No. C527XB900-0102-A) is in electrical contact with the thin metal substrate 26 and the thin metal substrate 26 is in electrical contact with the heat pipe 20. The positive terminal of the power supply 160 is connected to either the heat pipe 20 or the thin metal substrate 26. Alternatively and preferably, high reflectivity LEDs, such as Lumiled Part No. LXHL-PM02, may be used to enhance the output of the cavity. Alternatively, and most preferably, thin LEDs may be used that are designed specifically for light recycling cavities as described in pending U.S. patent application Ser. No. 10/952,112 entitled "LIGHT EMITTING DIODES EXHIBITING BOTH HIGH REFLECTIVIY AND HIGH LIGHT EXTRACTION," which is commonly assigned as the present application and herein incorporated by reference. The most preferred LEDs have very high reflectivity and may be used to get the full benefit of the light recycling cavity. The heat pipe 20 forms the positive ground connection to all of the LEDs mounted to it for each side of the recycling light cavity. Due to the recycling nature of the cavity, several enhancements are possible. As stated earlier, the interior surfaces of the cavity must be highly reflective to prevent absorption of recycled light.

In FIG. 4, all the LEDs 22 are connected together in parallel to one power supply. It is also possible to connect, for example, a first portion of the array of LEDs 22 to a first power supply and a second portion of the array of LEDs 22 to a second power supply. Arrangements with more than one power supply (not shown) are advantageous if the first portion of the array of LEDs 22 emits light of a first color and the second portion of the array of LEDs 22 emits light of a second color, different than the first color. With two power supplies, the light output of the first color may be varied separately from the light output of the second color. A variable composite color can be produced.

Figure 5A:
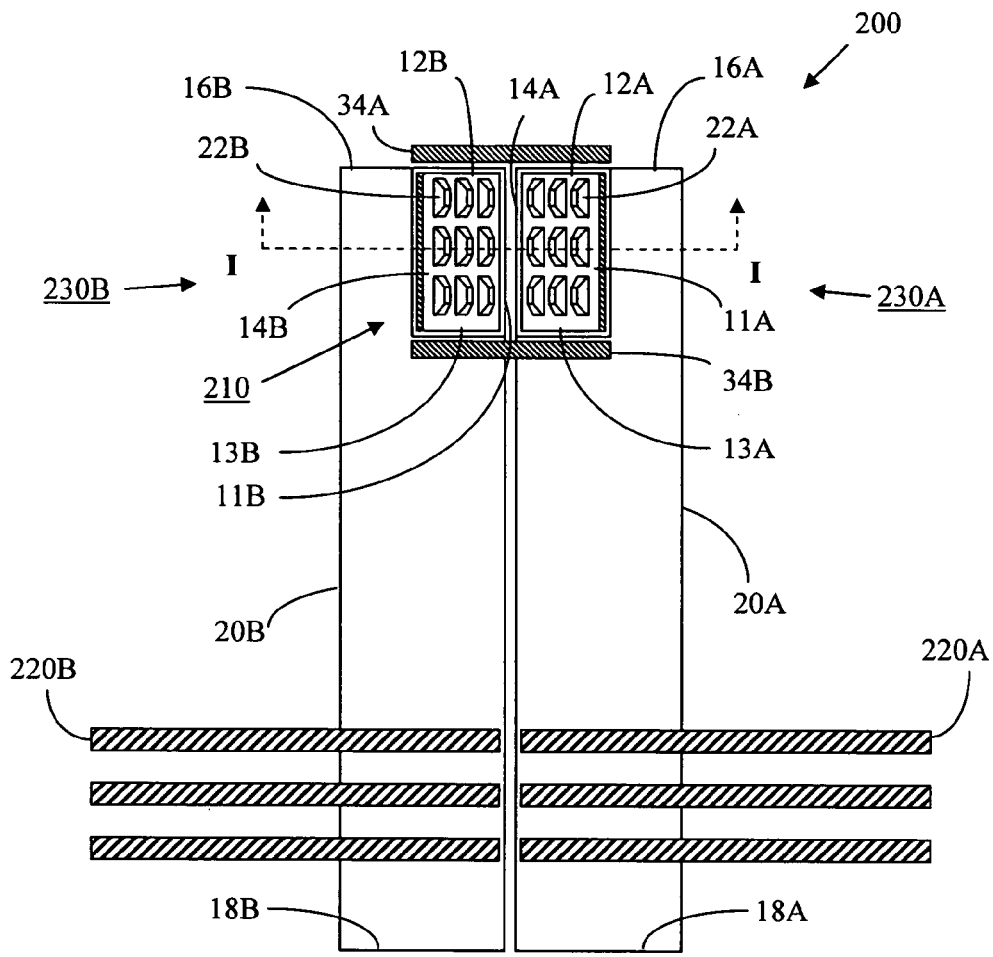
FIG. 5A shows two heat pipes side-by-side with an array of LEDs mounted to each of them and arranged to form a light recycling cavity.
Figure 5B:
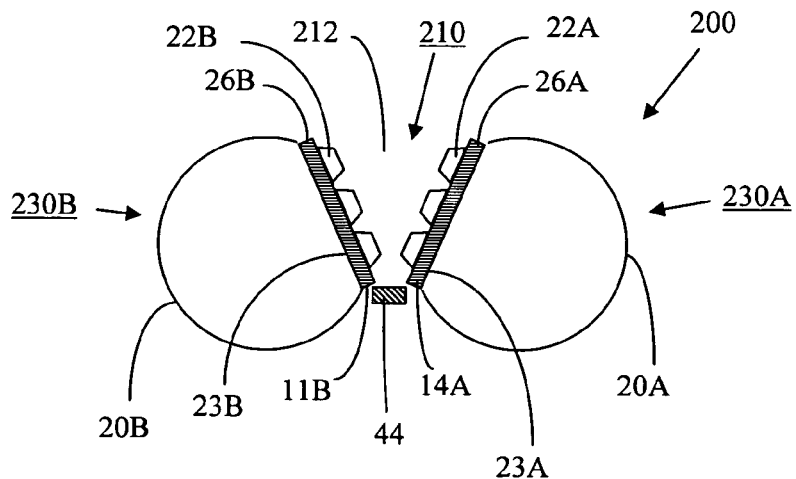
FIG. 5B shows a cross-sectional view along the I-I plane indicated in FIG. 5A [an end view] of the light recycling cavity created by the two heat pipes.
Figure 5C:
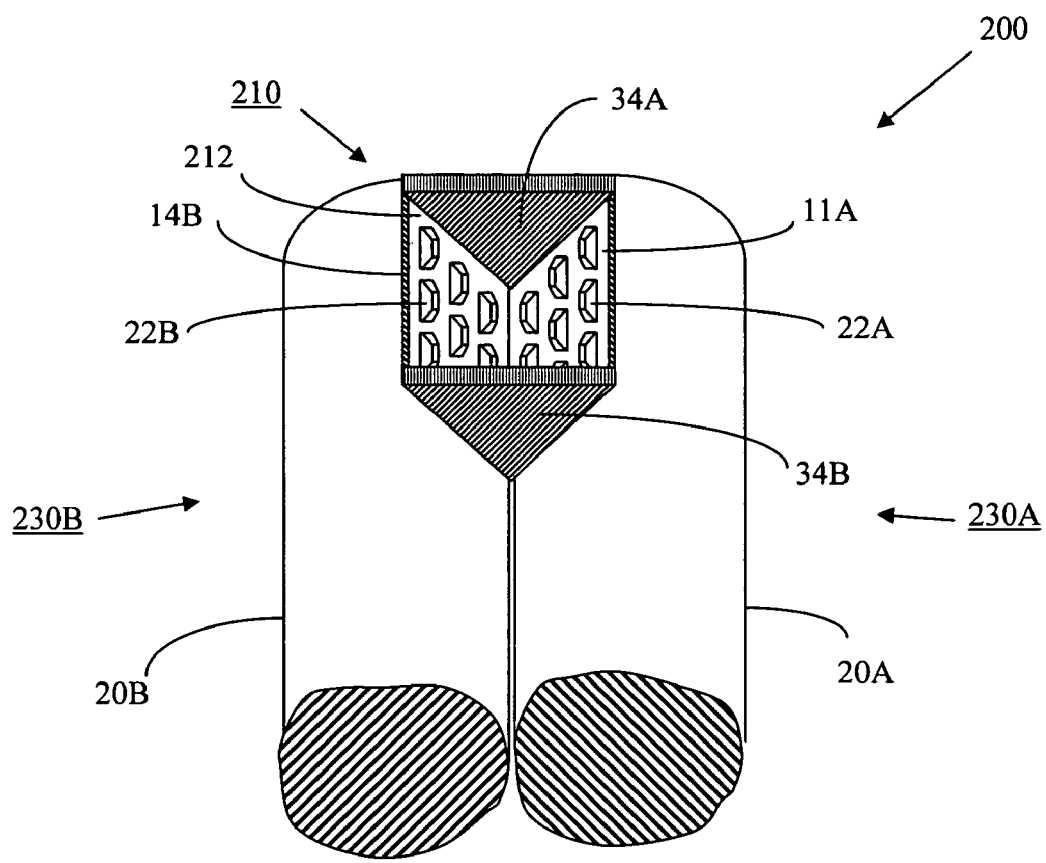
FIG. 5C is a magnified view of the light recycling cavity.

FIGS. 5A, 5B and 5C show an alternate embodiment of this invention, denoted as illumination system 200. Illumination system 200 has a light recycling cavity 210 formed using two arrays of LEDs, array of LEDs 22A and array of LEDs 22B, mounted onto two heat pipes, 20A and 20B. The heat pipes 20A and 20B are arranged with their heat dissipating ends extending in the same direction. An LED array 22A is bonded to a thin metal substrate 26A. The thin metal substrate 22A is bonded to the flat surface 23A of a cylindrical heat pipe 20A. A low temperature solder (for example bismuth tin) is used to attach the array of LEDs to the heat pipe. An LED array 22B is bonded to a thin metal substrate 26B. The thin metal substrate 22B is bonded to the flat surface 23B of a cylindrical heat pipe 20B.

The heat dissipation means consisting of cooling fins 220A are bonded to the heat pipe 20A by a low temperature solder (for example bismuth tin). Cooling fins 220B are bonded to the heat pipe 20B. The array of LEDs 22A on the flat surface 23A are at the first end 16A of the heat pipe 20A while the cooling fins 220A are at the second end 18A of the heat pipe 20A. The array of LEDs 22B on the flat surface 23B are at the first end 16B of the heat pipe 20B while the cooling fins 220B are at the second end 18B of the heat pipe 20B.

The first heat pipe 20A extends in the same direction as the second heat pipe 20B as shown in FIGS. 5A and 5C.

The fourth side 14A of the array of LEDs 22A on the flat surface 23A of the first heat pipe 20A is positioned adjacent to the first side 11B of the array of LEDs 22B on the flat surface 23B of the second heat pipe 20B.

Accordingly, the cooling fins 220A of the first heat pipe 20A are on the same end of the illumination system 200 as the cooling fins 220B of the second heat pipe 20B.

The array of LEDs 22A on the flat surface 23A of the first heat pipe 20A is angled relative to the array of LEDs 22B on the flat surface 23B of the second heat pipe 20B. The two LED arrays form a V-shaped tapered light recycling cavity.

As best shown in FIG. 5B, an optional rectangular diffuse reflector 44 is positioned parallel to and adjacent to the fourth side 14A of the array of LEDs 22A on the flat surface 23A of the first heat pipe 20A and the first side 11B of the array of LEDs 22B on the flat surface 23B of the second heat pipe 20B. The diffuse reflector 44 will reflect any emitted light from the two LED arrays into the light recycling cavity.

As best shown in FIGS. 5A and 5C, a first tapered diffuse reflector 34A is positioned perpendicular to and adjacent to the second side 12A of the array of LEDs 22A of the first heat pipe 20A and positioned perpendicular to and adjacent to the second side 12B of the array of LEDs 22B of the second heat pipe 20B. The first tapered diffuse reflector 34A is isosceles triangular in shape with a first side equal to a second side and with a third side, unequal to the first and second side and between the first and second side.

The first side of the first tapered diffuse reflector 34A is positioned perpendicular to and adjacent to the second side 12A of the array of LEDs 22A of the first heat pipe 20A. The second side of the first tapered diffuse reflector 34A is positioned perpendicular to and adjacent to the second side of the array of LEDs 22B of the second heat pipe 20B.

The first tapered diffuse reflector 34A has a diffuse reflective surface facing the LED arrays and will reflect any emitted light from the two LED arrays into the light recycling cavity.

A second tapered diffuse reflector 34B is positioned perpendicular to and adjacent to the third side 13A of the array of LEDs 22A of the first heat pipe 20A and positioned perpendicular to and adjacent to the third side 13B of the array of LEDs 22B of the second heat pipe 20B. The second tapered diffuse reflector 34B is isosceles triangular in shape with a first side equal to a second side and with a third side, unequal to the first and second side and between the first and second side.

The first side of the second tapered diffuse reflector 34B is positioned perpendicular to and adjacent to the third side 13A of the array of LEDs 22A of the first heat pipe 20A. The second side of the second tapered diffuse reflector 34B is positioned perpendicular to and adjacent to the third side 13B of the array of LEDs of the second heat pipe 20B.

The second tapered diffuse reflector 34B has a diffuse reflective surface facing the LED arrays and will reflect any emitted light from the two LED arrays into the light recycling cavity.

The tapered light recycling cavity 210 of the illumination system 200 consists of the array of LEDs 22A of the first heat pipe 20A, the array of LEDs 22B of the second heat pipe 20B, the rectangular diffuse reflector 44, the first tapered diffuse reflector 34A and the second tapered diffuse reflector 34B.

The entire interior area of the light recycling cavity, excluding the emitting areas of the LED, is coated with a high reflective light diffusing material (such as Gore DRP®, Avian, Fluorofilm™, Spectralon, barium sulfate, or the like). Diffuse reflectors are preferred due to their high reflectance at all angles and non-conductive nature, but metallic and dielectric reflectors are also embodiments of this invention. The areas surrounding the arrays of LEDs can coated before or after the full light recycling cavity is assembled.

The third side of the first diffuse reflector 34A, the first side 11A of the array of LEDs 22A of the first heat pipe 20A, the third side of the second diffuse reflector 34B and the fourth side 14B of the array of LEDs 22B of the second heat pipe 20B form a light output aperture 212 for the emitted light from the LED arrays and the reflected light from the array of LEDs and diffuse reflectors of the illumination system.

If the area of the light output aperture 212 of the light recycling cavity 210 is less than the total emitting area of the array of LEDs 22A and the array of LEDs 22B, then it is possible for the light exiting the cavity to be brighter than an equivalent single LED measured in the absence of recycling.

In order for brightness enhancement to occur, the LEDs and the inside surfaces of the light recycling cavity 210 must be highly reflective. Preferably the reflectivity of both the inside surfaces of the light-recycling cavity 210 and the LEDs is at least 50%. More preferably, the reflectivity of both the inside surfaces of the light-recycling cavity 210 and the LEDs is at least 70%. Most preferably, the reflectivity of both the inside surfaces of the light-recycling cavity 210 and the LEDs is at least 90%. Ideally, the reflectivity of the inside surfaces of the light recycling cavity 210 and the reflectivity of the LEDs should both be as close to 100% as possible in order to maximize the efficiency and the maximum exiting brightness of the illumination system.

The light recycling cavity of the illumination systems of FIG. 5 will emit and reflect light like the light recycling cavity of the illumination systems of FIG. 3. The heat pipes of the illumination systems of FIG. 5 can be joined in the same manner as the heat pipes of the illumination systems of FIG. 3. The contact wires, electrodes and electrical circuitry for the illumination systems of FIG. 5 will be the same as the illumination systems of FIG. 3.

Another light recycling cavity formed using LEDs mounted directly to heat pipes is shown in FIG. 6.

Figure 6A:
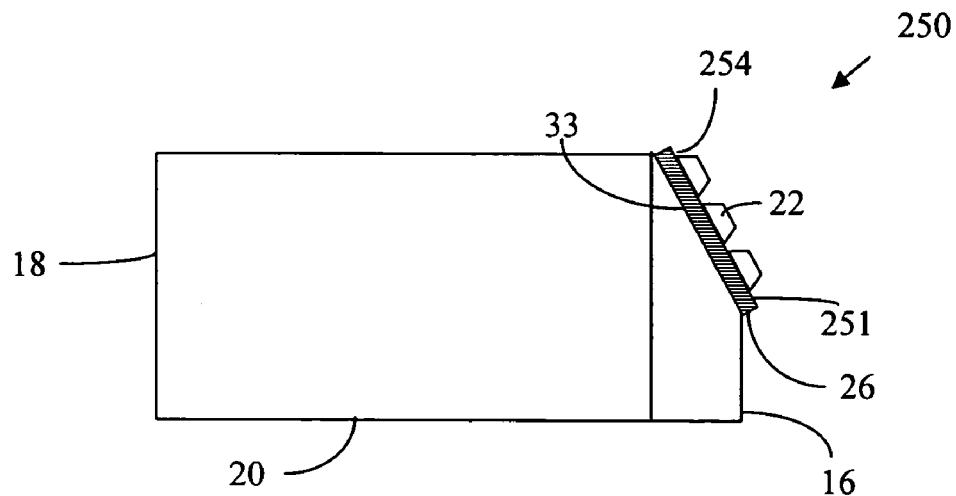
FIG. 6A shows a side view of the LED die mounted on a beveled end of the heat pipe.
Figure 6B:
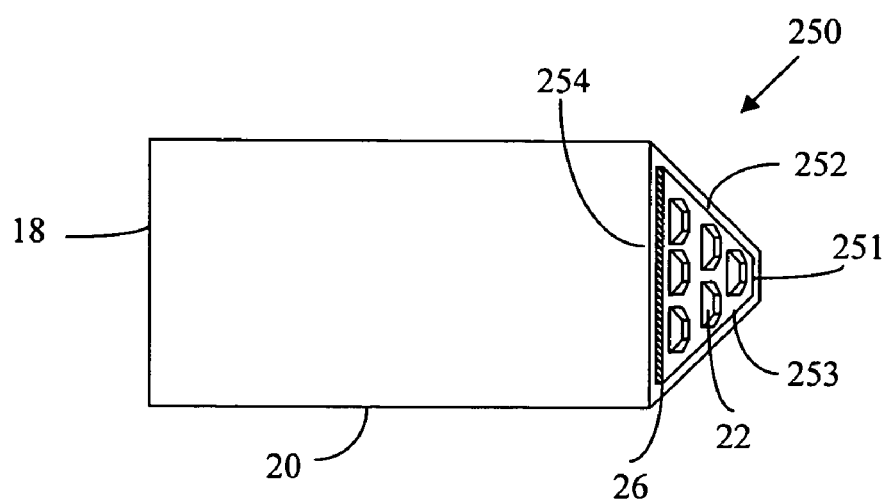
FIG. 6B shows a top view of the LED die mounted on a beveled end of the heat pipe.

In FIGS. 6A and 6B, the heat pipe 20 of high intensity light source 250 has a flat surface 33. The flat surface 33 is angled at one end 16 of the heat pipe 20 to form a beveled surface 33.

An array of LEDs 22 is bonded to a thin metal substrate 26. The thin metal substrate 26 is bonded to the surface 33 of a heat pipe 20. A low temperature solder (for example bismuth tin) is used to attach the thin metal substrate 26 to the heat pipe. The areas of the beveled surface 33 surrounding the LEDs 22 are covered with a highly reflective diffuse material such as Gore DRP®, aluminum, Teflon, or similar material.

The array of LEDs 22 has a first side 251, a second side 252, a third side 253, and a fourth side 254. The array of LEDs 22 on the flat surface is a trapezoid with the first side 251 parallel to the fourth side 254. The first side 251 is shorter in length than the fourth side 254. The short first side 251 is closer to the center of the heat pipe while the longer fourth side 254 is closer to the outer surface of the heat pipe. The second side 254 and the third side 253 are opposite each other. The second side 252 and the third side 253 are equal in length with reversed angles relative to a normal and relative to the first and fourth parallel sides. The shape of the array of LEDs on the flat surface can also be described as a truncated isosceles triangle or isosceles triangle frustum.

Figure 6C:
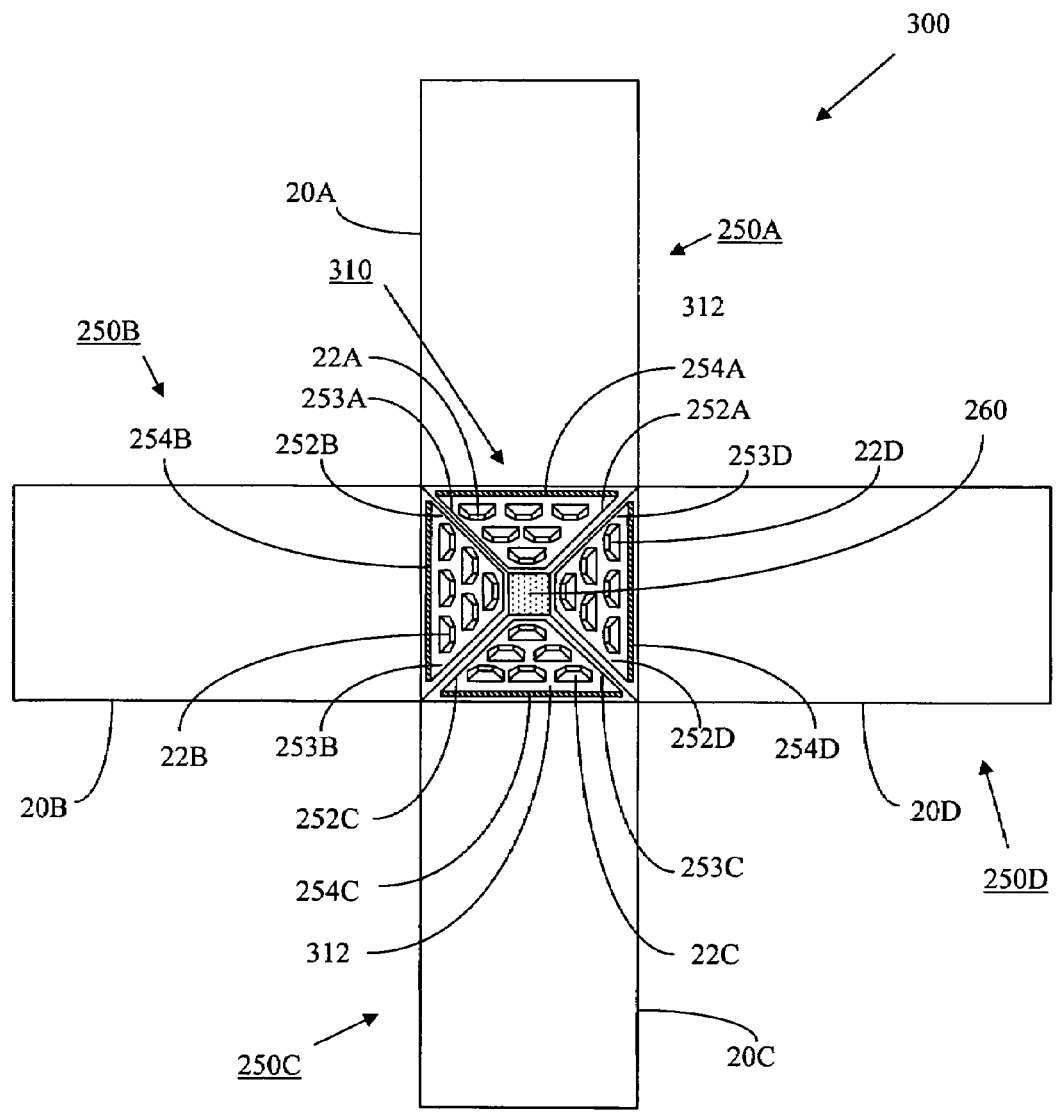
FIG. 6C shows a top view of the beveled faces of four heat pipes with an array of LEDs mounted to each of them and arranged to form a light recycling cavity.
Figure 7A:
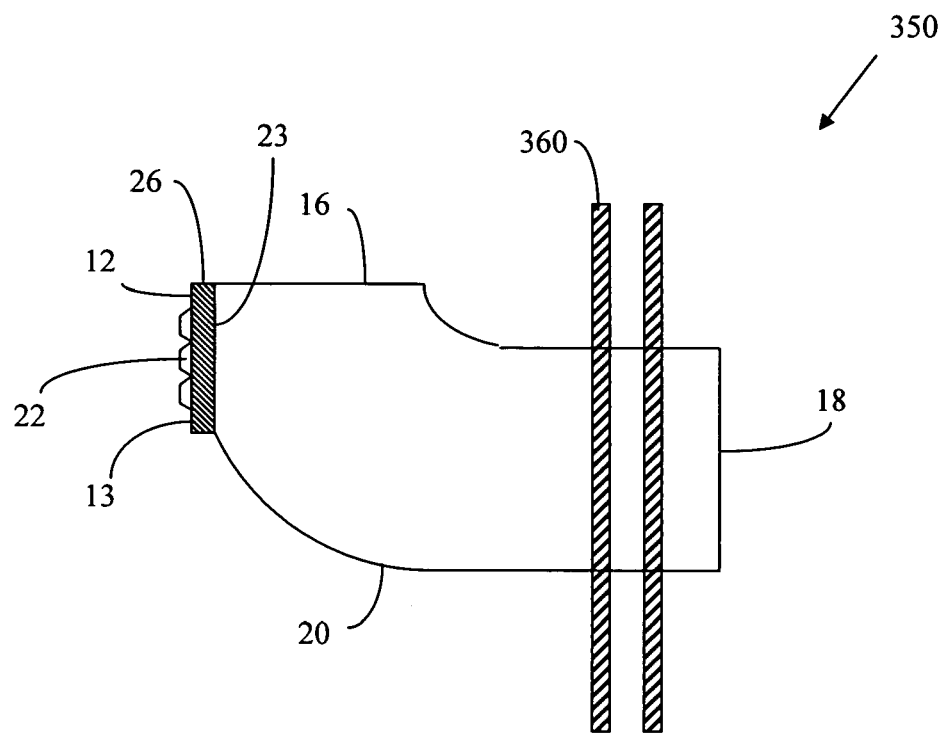
FIG. 7A shows a side view of an array of LEDs mounted directly onto a heat pipe, where the heat pipe is bent in a 90-degree angle.
Figure 7B:
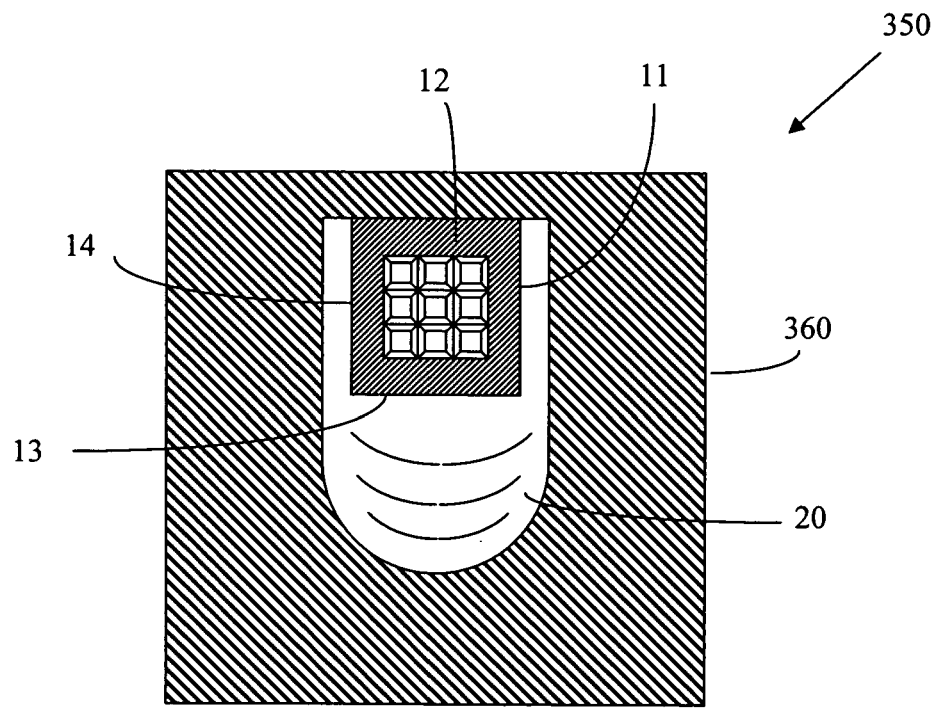
FIG. 7B shows another side view facing the array of LEDs.
Figure 7C:
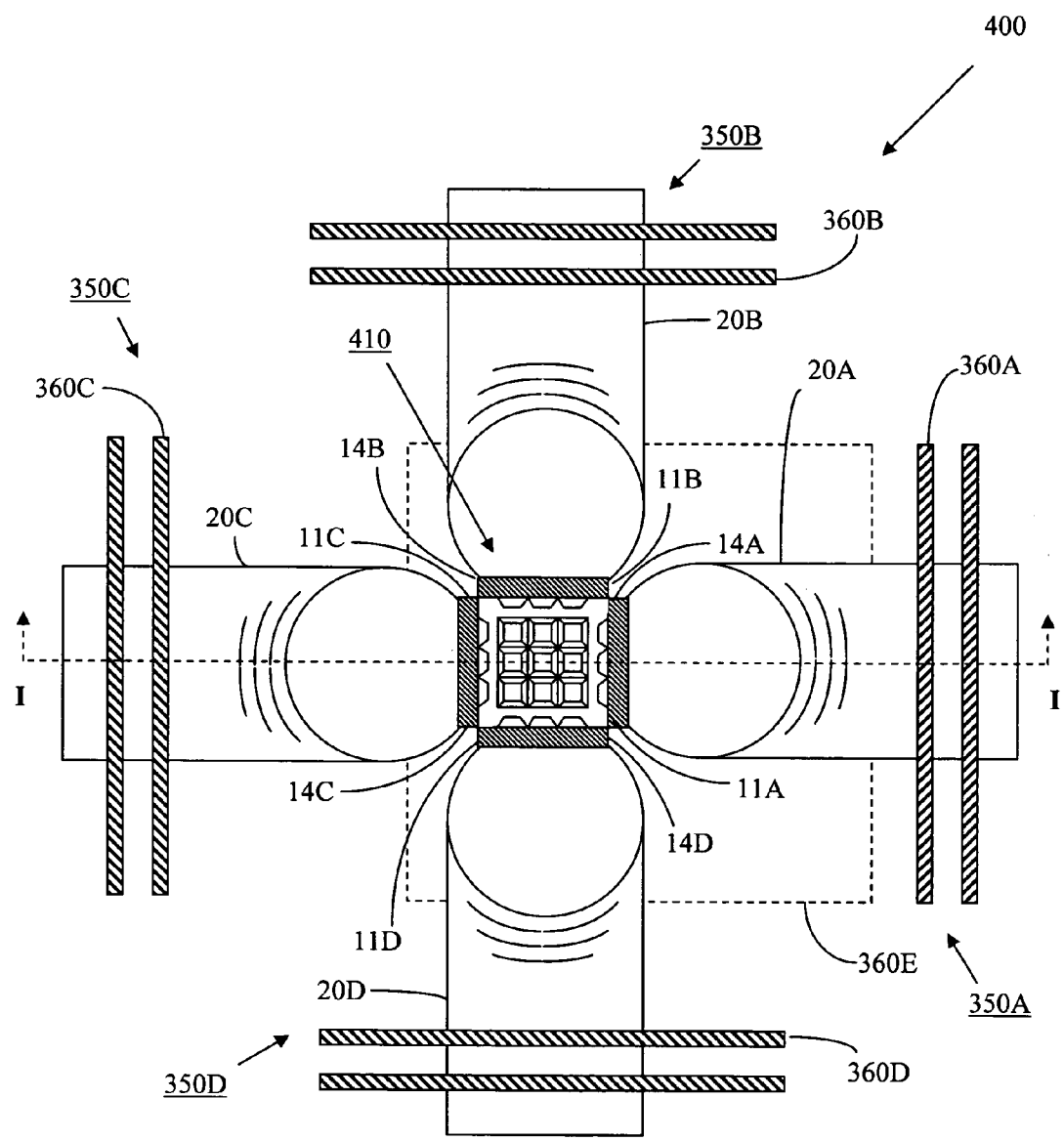
FIG. 7C shows a top view of five heat pipes, each with an array of LEDs, arranged to form a cubical light recycling cavity. The fifth array of LEDs is visible in this view, but the fifth heat pipe is hidden from view.
Figure 7D:
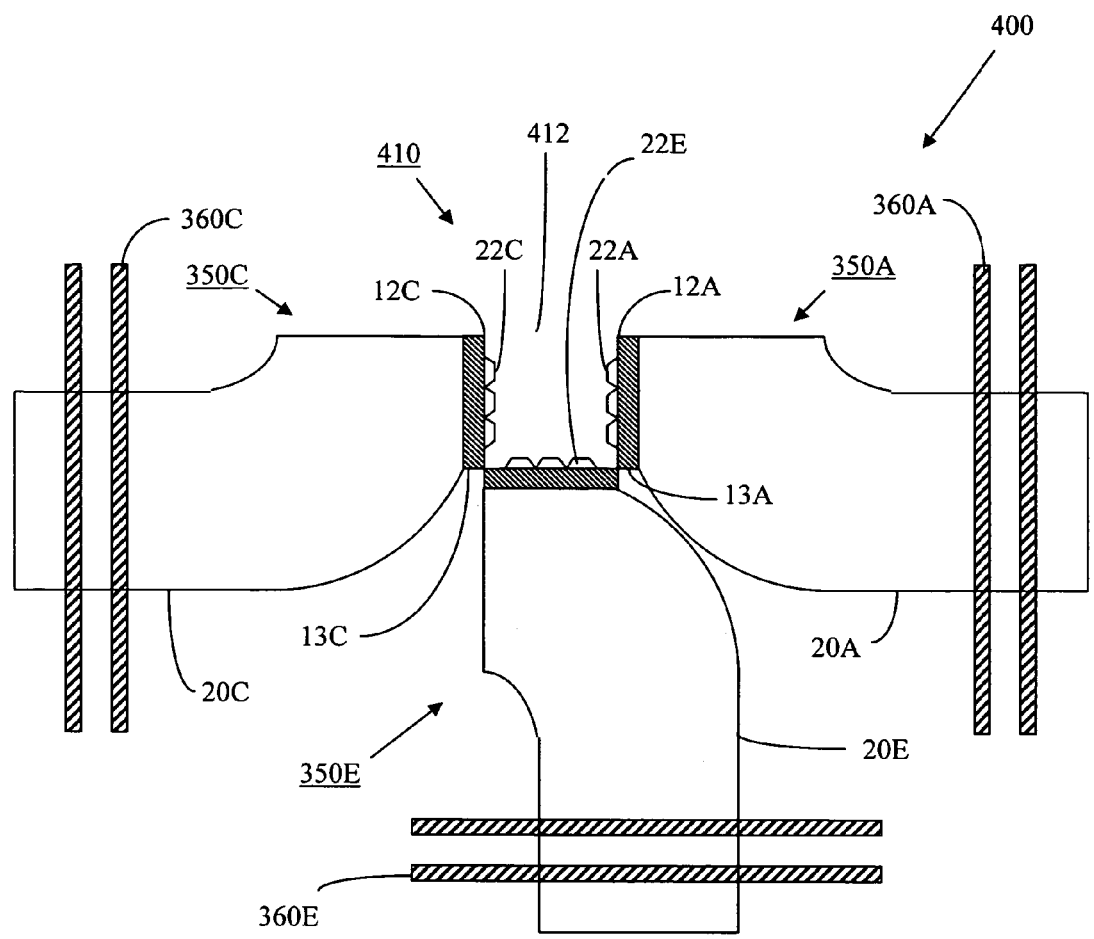
FIG. 7D shows a cross-sectional view along the I-I plane indicated in FIG. 7C. The fifth heat pipe and its associated array of LEDs are visible in this view.

As best shown in FIG. 6C, the illumination system 300 has a light recycling cavity 310 formed from four identical high intensity light sources 250A, 250B, 250C and 250D. Each high intensity light source is comprised of an array of LEDs mounted on the beveled surfaces of a heat pipe.

Each of the four heat pipes, 20A, 20B, 20C and 20D, is arranged at right angles, 90 degrees, relative to the two adjacent heat pipes. The beveled surfaces at the end of each heat pipe are positioned adjacent to two other beveled surfaces of two other heat pipes. Specifically, the beveled surface of the first heat pipe 20A is adjacent to the beveled surface of the second heat pipe 20B and the fourth heat pipe 20D. The beveled surface of the second heat pipe 20B is adjacent to the beveled surface of the third heat pipe 20C and the first heat pipe 20A. The beveled surface of the third heat pipe 20C is adjacent to the beveled surface of the fourth heat pipe 20D and the second heat pipe 20B. The beveled surface of the fourth heat pipe 20D is adjacent to the beveled surface of the first heat pipe 20A and the third heat pipe 20C.

The third side 253A of the array of LEDs 22A on the first heat pipe 20A is positioned adjacent to the second side 252B of the array of LEDs 22B on the second heat pipe 20B. The third side 253B of the array of LEDs 22B on the second heat pipe 20B is positioned adjacent to the second side 252C of the array of LEDs 22C on the third heat pipe 20C. The third side 253C of the array of LEDs 22C on the third heat pipe 20C is positioned adjacent to the second side 252D of the array of LEDs 22D on the fourth heat pipe 20D. The third side 253D of the array of LEDs 22D on the fourth heat pipe 20D is positioned adjacent to the second side 252A of the array of LEDs 22A on the first heat pipe 20A.

A square diffuse reflector 260 is positioned adjacent to the first side 251A of the array of LEDs 22A on the first heat pipe 20A, the first side 251B of the array of LEDs 22B on the second heat pipe 20B, the first side 251C of the array of LEDs 22C on the third heat pipe 20C, and the first side 251D of the array of LEDs 22D on the fourth heat pipe 20D.

The square diffuse reflector 260 is at the base of the light recycling cavity 310. The diffuse reflector 260 has a diffuse reflective surface facing the arrays of LEDs and will reflect any emitted light from the four arrays of LEDs into the light recycling cavity 310.

The light recycling cavity 310 has a truncated pyramid or pyramid frustum shape. The light recycling cavity 310 of the illumination system 300 consists of the array of LEDs 22A of the first heat pipe 20A, the array of LEDs 22B of the second heat pipe 20B, the array of LEDs 22C of the third heat pipe 20C, the array of LEDs 22D of the fourth heat pipe 20D, and the square diffuse reflector 260.

The entire interior area of the light recycling cavity, excluding the emitting areas of the LEDs, is coated with a high reflective light diffusing material (such as Gore DRP®, Avian, Fluorofilm™, Spectralon, barium sulfate, or the like). Diffuse reflectors are preferred due to their high reflectance at all angles and non-conductive nature, but metallic and dielectric reflectors are also embodiments of this invention. The areas surrounding the LEDs can coated before or after the full light recycling cavity is assembled.

The fourth side 254A of the array of LEDs 22A on the first heat pipe 20A, the fourth side 254B of the array of LEDs 22B on the second heat pipe 20B, the fourth side 254C of the array of LEDs 22C on the third heat pipe 20C, and the fourth side 254D of the array of LEDs 22D on the fourth heat pipe 20D form a light output aperture 312 for the emitted light from the arrays of LEDs and the reflected light from the arrays of LEDs and the diffuse reflector 260 of the illumination system.

If a smaller light output aperture is desired without changing the shape of the light recycling cavity 310, an optional reflector (not shown) having a smaller light output aperture may be used to cover the opening formed by the fourth side 254A of the array of LEDs 22A on the first heat pipe 20A, the fourth side 254B of the array of LEDs 22B on the second heat pipe 20B, the fourth side 254C of the array of LEDs 22C on the third heat pipe 20C, and the fourth side 254D of the array of LEDs 22D on the fourth heat pipe 20D. A smaller light output aperture may be desirable to effectively couple the light output to other optical systems such as projection displays.

If the area of the light output aperture 312 of the light recycling cavity 310 is less than the total emitting area of the array of LEDs 22A, the array of LEDs 22B, the array of LEDs 22C and the array of LEDs 22D, then it is possible for the light exiting the cavity to be brighter than an equivalent single LED measured in the absence of recycling.

In order for brightness enhancement to occur, the LEDs and the inside surfaces of the light recycling cavity 310 must be highly reflective. Preferably the reflectivity of both the inside surfaces of the light-recycling cavity 310 and the LEDs is at least 50%. More preferably, the reflectivity of both the inside surfaces of the light-recycling cavity 310 and the LEDs is at least 70%. Most preferably, the reflectivity of both the inside surfaces of the light-recycling cavity 310 and the LEDs is at least 90%. Ideally, the reflectivity of the inside surfaces of the light recycling cavity 310 and the reflectivity of the LEDs should both be as close to 100% as possible in order to maximize the efficiency and the maximum exiting brightness of the illumination system.

The cooling fins on each heat pipe for heat dissipation of the illumination system 300 are not shown.

The reversed angles from the normal for the second and third sides of the LED array on the beveled surface determine the depth of the light recycling cavity. The larger the angles are, the shallower the cavity is. And vice versa, the smaller the angles are, the deeper the cavity is.

The four heat pipes forming a light recycling are merely an illustrative example of the illumination system.

Three or more heat pipes with LED arrays on beveled surfaces at the ends of the heat pipe can form the light recycling cavity of the illumination system. Each heat pipe will be equi-angular from the adjacent heat pipe around a 360 degree circle to form the light recycling cavity. For example, three heat pipes will be spaced 120 degrees apart, five heat pipes will be spaced 72 degrees apart, six heat pipes will be spaced 60 degrees apart and so on. The diffuse reflector at the base of the light recycling cavity will have the same number of equal sides as there are heat pipes in the illumination system. A three heat pipes light recycling cavity will have an equilateral triangular diffuse reflector at the base. A five heat pipes light recycling cavity will have an equilateral pentagon diffuse reflector at the base. A six heat pipes light recycling cavity will have an equilateral hexagon diffuse reflector at the base. And so on. Since the heat pipes and the beveled surfaces are the same, the diffuse reflector will always be an equilateral geometric shape.

The beveled surface can alternatively be isosceles triangular in shape with the non-equal side being the light output aperture side. With triangular beveled surfaces, there is no diffuse reflector at the base of the light recycling cavity.

The light recycling cavity of the illumination systems of FIG. 6 will emit and reflect light like the light recycling cavity of the illumination systems of FIG. 3. The heat pipes of the illumination systems of FIG. 6 can be joined in the same manner as the heat pipes of the illumination systems of FIG. 3. The contact wires, electrodes and electrical circuitry for the illumination systems of FIG. 6 will be the same as the illumination systems of FIG. 3.

Another embodiment of this invention is illustrated in FIG. 7. FIGS. 7A and 7B illustrate high intensity light source 350. FIGS. 7C and 7D illustrate illumination system 400, which is comprised of five high intensity light sources, 350A, 350B, 350C, 350D and 350E, arranged to form a cubical light recycling cavity 410. Five arrays of LEDs 22A, 22B, 22C, 22D and 22E, mounted on the surfaces of five identical heat pipes form the light emitting surfaces on five sides of the cubical light recycling cavity 410. The sixth side of the cubical light recycling cavity 410 is the light output aperture 412 of the cavity.

High intensity light source 350 is functionally equivalent to high intensity light source 10 in FIG. 2. However, the heat pipe 20 in the high intensity light source 350 is bent at a 90 degree angle whereas the heat pipe 20 in the high intensity light source 10 is straight. In addition, high intensity light source 350 has cooling fins 360 oriented perpendicular to the axis of the adjacent portion of the heat pipe 20, whereas high intensity light source 10 is illustrated without heat fins.

Although heat pipe 20 is shown bent at a 90-degree angle, it is possible for heat pipe 20 to be straight, curved or bent at an angle. Appropriate bend angles range from about 10 degrees to about 180 degrees. However, bends that have angles greater than about 45 degrees must be gradual bends so that the flow of fluid and vapor inside heat pipe 20 is not restricted.

High intensity light source 350 is comprised of an array of LEDs 22, a thin metal substrate 26, a bent heat pipe 20 and two cooling fins 360. The array of LEDs 22 has a first side 11, a second side 12, a third side 13 and a fourth side 14. The first side 11 is opposite and parallel to the fourth side 14. The second side 12 is opposite and parallel to the third side 13. The second side 12 and third side 13 are parallel to the cross section of the heat pipe 10 and are perpendicular the first side 11 and the fourth side 14.

The heat pipe 10 has a first end 16 and a second end 18. The first end 16 of the heat pipe is closest to the array of LEDs 22 and the second side 12 of the array of LEDs 22 is closest to the first end 16 of the heat pipe. The second end 18 of the heat pipe, the end with the cooling fins 360, is farthest away from the array of LEDs 22 and the third side 13 of the array of LEDs is closest to the second end 18 of the heat pipe.

The LEDs 22 in the array are reflective to external light generated by other light sources or other arrays of LEDs.

The array of LEDs 22 is bonded to a thin metal substrate 26. The thin metal substrate 26 is bonded to the flat surface 23 of the circular heat pipe 20. The thin metal substrate 26 is preferably a reflective metal such as, for example, silver or aluminum. A low temperature solder (for example bismuth tin) is used to attach the thin metal substrate 26 to the heat pipe.

Four of the high intensity light sources, 350A, 350B, 350C and 350D, are arranged to form four sides of the cubical light recycling cavity. The LED array surfaces at the end of each high intensity light source are positioned adjacent to two other LED array surfaces of two other high intensity light sources. Specifically, the LED array surface of the first high intensity light source 350A is adjacent to the LED array surface of the second and fourth high intensity light sources, 350B and 350D. The LED array surface of the second high intensity light source 350B is adjacent to the LED array surface of the third and first high intensity light sources, 350C and 350A. The LED array surface of the third high intensity light source 350C is adjacent to the LED array surface of the fourth and second high intensity light sources, 350D and 350B. The LED array surface of the fourth high intensity light source 350D is adjacent to the LED array surface of the first and third high intensity light sources, 350A and 350C.

The LED array surfaces of the fifth high intensity light source, 350E, are adjacent to the LED array surfaces of the other four high intensity light sources, 350A, 350B, 350C and 350D.

The fourth side 14A of the array of LEDs 22A on the first high intensity light source 350A is positioned adjacent to the first side 11B of the array of LEDs 22B on the second high intensity light source 350B. The fourth side 14B of the array of LEDs 22B on the second high intensity light source 3501B is positioned adjacent to the first side 11C of the array of LEDs 22C on the third high intensity light source 350C. The fourth side 14C of the array of LEDs 22C on the third high intensity light source 350C is positioned adjacent to the first side 11D of the array of LEDs 22D on the fourth high intensity light source 350D. The fourth side 14D of the array of LEDs 22D on the fourth high intensity light source 350C is positioned adjacent to the first side 11A of the array of LEDs 22A on the first high intensity light source 350A.

The sides 11E, 12E, 13E and 14E of the fifth high intensity light source 350E are positioned, respectively, adjacent to side 13B of high intensity light source 350B, side 13C of high intensity light source 350C, side 13A of high intensity light source 350A and side 13D of high intensity light source 350D.

The entire interior area of the light recycling cavity, excluding the emitting areas of the LED, is coated with a high reflective light diffusing material (such as Gore DRP®, Avian, Fluorofilm™, Spectralon, barium sulfate, or the like). Diffuse reflectors are preferred due to their high reflectance at all angles and non-conductive nature, but metallic and dielectric reflectors are also embodiments of this invention. The areas surrounding the LEDs can be coated before or after the full light recycling cavity is assembled.

The second side 12A of the array of LEDs 22A on the first high intensity light source 350A, the second side 12B of the array of LEDs 22B on the second high intensity light source 350B, the second side 12C of the array of LEDs 22C on the third high intensity light source 350C, and the second side 12D of the LED array on the fourth high intensity light source 350D form a light output aperture 412 for the emitted light from the arrays of LEDs and the reflected light from the arrays of LEDs and diffuse reflectors of the illumination system 400.

If a smaller light output aperture is desired without changing the size of the light recycling cavity 410, an optional reflector (not shown) having a smaller light output aperture may be used to cover the opening formed by the second side 12A of the high intensity light source 350A, the second side 12B of the high intensity light source 350B, the second side 12C of the high intensity light source 350C and the second side 12D of the high intensity light source 350D. A smaller light output aperture may be desirable to effectively couple the light output to other optical systems such as projection displays.

As described previously, if the area of the light output aperture of the light recycling cavity 410 is less than the total emitting area of the array of LEDs 22A, the array of LEDs 22B, the array of LEDs 22C, the array of LEDs 22D and the array of LEDs 22E, then it is possible for the light exiting the cavity to be brighter than an equivalent single LED measured in the absence of recycling.

In order for brightness enhancement to occur, the LEDs and the inside surfaces of the light recycling cavity must be highly reflective. Preferably the reflectivity of both the inside surfaces of the light-recycling cavity 410 and the LEDs is at least 50%. More preferably, the reflectivity of both the inside surfaces of the light-recycling cavity 410 and the LEDs is at least 70%. Most preferably, the reflectivity of both the inside surfaces of the light-recycling cavity 410 and the LEDs is at least 90%. Ideally, the reflectivity of the inside surfaces of the light recycling cavity and the reflectivity of the LEDs should both be as close to 100% as possible in order to maximize the efficiency and the maximum exiting brightness of the illumination system.

The light recycling cavity 410 of the illumination systems of FIG. 7 will emit and reflect light like the light recycling cavity of the illumination systems of FIG. 3. The heat pipes of the illumination systems of FIG. 7 can be joined in the same manner as the heat pipes of the illumination systems of FIG. 3. The contact wires, electrodes and electrical circuitry for the illumination systems of FIG. 7 will be the same as the illumination systems of FIG. 3.

As shown by these various embodiments, a light recycling cavity can be formed using different combinations of flat or beveled faces of heat pipes and LEDs mounted directly or indirectly via a thin metal substrate to the flat or beveled faces. The same color or different color LEDS can be used within the array or each array can be composed of different color LEDs. By using separate colors on separate heat pipes the illumination system may electrically isolate each color and by adjusting the brightness of each color, create a selectable variable colored light source within a single light recycling cavity.

An illumination system can be formed from multiple light recycling cavities.

An illumination system can utilize two optical illumination systems including two light recycling cavities and two light collimating elements. The two optical illumination systems share one polarization cube prism. Light of a first polarization state will be emitted by the first light recycling cavity to be transmitted through the polarization cube prism. Light of the second polarization state will be emitted by the first light recycling cavity and reflected by the polarization cube prism into the second light recycling cavity. Reflections within the second light recycling cavity will change a portion of the light's polarization state to the first polarization state. Similarly, light of a first polarization state will be emitted by the second light recycling cavity to be transmitted through the polarization cube prism. Light of the second polarization state will be emitted by the second light recycling cavity and reflected by the polarization cube prism into the first light recycling cavity. Reflections within the second light recycling cavity will change a portion of the light's polarization state to the first polarization state. Light transmitted through the polarization cube prism can be reflected from a total specular reflector and transmitted through a prism to form collimated light from both light recycling cavities. A similar illumination system using light recycling cavities is disclosed in pending U.S. patent application Ser. No. 10/445,136, entitled "ILLUMINATION SYSTEMS UTILIZING HIGHLY REFLECTIVE LIGHT EMITTING DIODES AND LIGHT RECYCLING TO ENHANCE BRIGHTNESS", commonly assigned as the present application and herein incorporated by reference.

An illumination system can utilize three light recycling illumination systems, each emitting light of a different color, a light combining means, an imaging light modulator, a projection lens and a viewing screen. The imaging light modulator can be a DLP device or an LCOS device with a reflecting polarizer, such as a beam-splitting prism polarizer. Because the red light, green light and blue light are generated in three separate light recycling cavities, a light combining means is required to combine the resulting three light beams into one beam. Examples of light combining means include, but are not limited to, an x-cube prism and a Philips prism. The Philips prism is a trichroic prism assembly comprising three prisms. Lights of different color will be emitted by the three light recycling cavities, combined in the light combining means, modulated by the imaging light modulator and projected by the projection lens onto a viewing screen to provide a full color image. A similar illumination system using light recycling cavities is disclosed in pending U.S. patent application Ser. No. 10/815,005, entitled "PROJECTION DISPLAY SYSTEMS UTILIZING LIGHT EMITTING DIODES AND LIGHT RECYCLING", commonly assigned as the present application and herein incorporated by reference.

Figure 8:
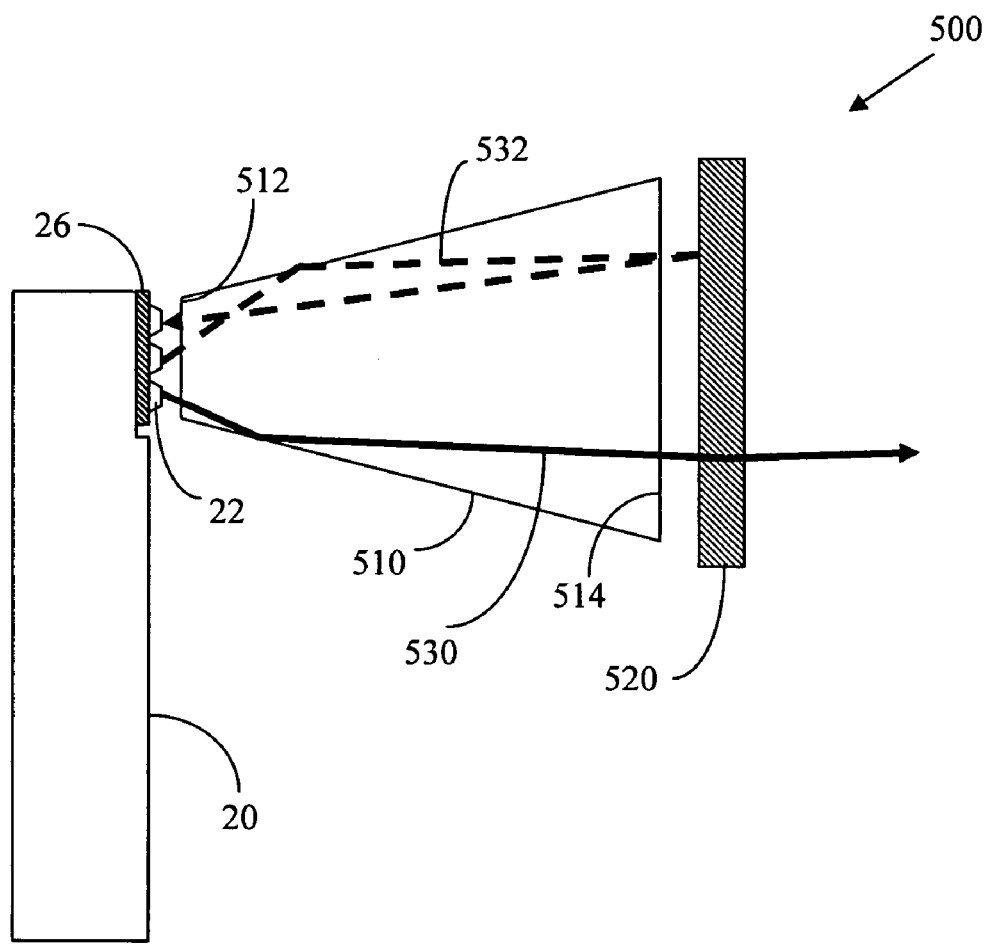
FIG. 8 shows another arrangement of forming a high intensity light source using LEDs mounted directly to a heat pipe with an optical collimating element collecting light emitted by the LEDs and illuminating a reflecting polarizer which provides recycling of the light back to the LEDs through the collimator and back through the reflective polarizer.

Another embodiment of the present invention is illumination system 500 shown in cross-section in FIG. 8. Illumination system 500 is an example of an illumination system that incorporates a heat pipe and light recycling, but does not have a light recycling cavity. Illumination system 500 is comprised of an array of LEDs 22 mounted on a thin metal substrate 26, a heat pipe 20, a light collimating means 510 and a reflective polarizer 520. Illumination system 500 can be used as part of a projection display system or other system that requires light that is partially collimated and polarized.

The configuration of the LEDs, the substrate and the heat pipe is illustrated previously in FIG. 2B. Preferably the LEDs and the exposed areas of the substrate 26 are highly reflective.

The light collimating means can be, for example, a tapered waveguide, a compound parabolic reflector, a lens or a combination of these elements. In FIG. 8, the light collimating means is a tapered waveguide 510 that has an input surface 512 and an output surface 514. The input surface 512 is adjacent to the LEDs 22 and accepts light emitted by the LEDs. The tapered waveguide 510 partially collimates the light from the LEDs and directs the partially collimated light through the output surface 514. In order for the tapered waveguide 510 to partially collimate the light, the area of the output surface 514 must be larger than the area of the input surface 512.

The reflective polarizer 520 transmits light of a first polarization state and reflects light of a second polarization state. The light may have any wavelength or color. The polarization states may be linear polarization states or circular polarization states. Reflective polarizer 520 is positioned adjacent to the output surface 514 of tapered waveguide 510. Examples of suitable reflective polarizers are Vikuiti™ Dual Brightness Enhancement Film (DBEF) made by 3M Corporation and polarizers made by NanoOpto Corporation and Moxtek Incorporated that utilize subwavelength optical elements or wire-grid optical elements.

Light rays 530 and 532 illustrate the operation of illumination system 500. Light ray 530 of a first polarization state (solid line) is emitted by an LED 22, is transmitted through input surface 512, is partially collimated by tapered waveguide 510 and exits tapered waveguide 510 as partially collimated light. Reflective polarizer 520 transmits light ray 530 of a first polarization state.

Light ray 532 of a second polarization state (dashed line) is emitted by an LED 22, is transmitted through input surface 512, is partially collimated by tapered waveguide 510 and exits output surface 514 as partially collimated light. Reflective polarizer 520 reflects and recycles light ray 530 of a second polarization state back through the tapered waveguide 510 to the LEDs 22. Since the LEDs 22 reflect light, the recycled light can be reflected by the LEDs and thereby increase the effective brightness of the LEDs. Furthermore, when the recycled light of a second polarization state reflects from the LEDs, a portion of the recycled light can be converted into light of a first polarization state. The reflected and converted light of a first polarization state can then be transmitted through the tapered waveguide and through the reflective polarizer and increase the overall brightness and output efficiency of illumination system 500.

Numerous other light recycling cavities can be formed using other combinations which are still in the scope of this invention.

While the invention has been described in conjunction with specific embodiments and examples, it is evident to those skilled in the art that many alternatives, modifications and variations will be apparent in light of the foregoing description.

Accordingly, the invention is intended to embrace all such alternatives, modifications and variations as fall within the spirit and scope of the appended claims.

What is claimed is:

1. An illumination system, comprising:
a first array of light emitting diodes, wherein said first array of light emitting diodes emits light and wherein said first array of light emitting diodes reflects incident light;
a first heat pipe, said first array of light emitting diodes being bonded to said first heat pipe, wherein said first heat pipe dissipates heat from said first array of light emitting diodes;
a second array of light emitting diodes, wherein said second array of light emitting diodes emits light and wherein said second array of light emitting diodes reflects incident light;
a second heat pipe, said second array of light emitting diodes being bonded to said second heat pipe, wherein said second heat pipe dissipates heat from said second array of light emitting diodes;
a third array of light emitting diodes, wherein said third array of light emitting diodes emits light and wherein said third array of light emitting diodes reflects incident light;
a third heat pipe, said third array of light emitting diodes being bonded to said third heat pipe, wherein third first heat pipe dissipates heat from said third array of light emitting diodes;
a fourth array of light emitting diodes, wherein said fourth array of light emitting diodes emits light and wherein said fourth array of light emitting diodes reflects incident light;

a fourth heat pipe, said fourth array of light emitting diodes being bonded to said fourth heat pipe, wherein said fourth heat pipe dissipates heat from said fourth array of light emitting diodes;

a fifth array of light emitting diodes, wherein said fifth array of light emitting diodes emits light and wherein said fifth array of light emitting diodes reflects incident light;

a fifth heat pipe, said fifth array of light emitting diodes being bonded to said fifth heat pipe, wherein said fifth heat pipe dissipates heat from said fifth array of light emitting diodes;

wherein said first heat pipe, said second heat pipe, said third heat pipe and said fourth heat pipe extend at right angles to the adjacent heat pipe, further wherein said fifth heat pipe is at right angles to first heat pipe, said second heat pipe, said third heat pipe and said fourth heat pipe, said heat pipes forming a cubical light recycling cavity; and a light recycling means in said cubical light recycling cavity formed by said first array of light emitting diodes on said first heat pipe; said second array of light emitting diodes on said second heat pipe; said third array of light emitting diodes on said third heat pipe; said fourth array of light emitting diodes on said fourth heat pipe; and said fifth array of light emitting diodes on said fifth heat pipe;

wherein said light recycling means reflects and recycles a portion of said light emitted by said first array of light emitting diodes; reflects and recycles a portion of said light emitted by said second array of light emitting diodes; reflects and recycles a portion of said light emitted by said third array of light emitting diodes; reflects and recycles a portion of said light emitted by said fourth array of light emitting diodes; and reflects and recycles a portion of said light emitted by said fifth array of light emitting diodes.

2. The illumination system of claim 1, wherein said first heat pipe is electrically conductive for supplying power to said first array of light emitting diodes, said second heat pipe is electrically conductive for supplying power to said second array of light emitting diodes, said third heat pipe is electrically conductive for supplying power to said third array of light emitting diodes, said fourth heat pipe is electrically conductive for supplying power to said fourth array of light emitting diodes, and said fifth heat pipe is electrically conductive for supplying power to said fifth array of light emitting diodes.

3. The illumination system of claim 1, wherein said first array of light emitting diodes, said second array of light emitting diodes, said third array of light emitting diodes, said fourth array of light emitting diodes and said fifth array of light emitting diodes emit light of at least two different colors.

4. The illumination system of claim 1 wherein at least one of wherein said first array of light emitting diodes, said second array of light emitting diodes, said third array of light emitting diodes, said fourth array of light emitting diodes and said fifth array of light emitting diodes emits light of at least two different colors.

5. The illumination system of claim 1, wherein said first heat pipe is bent at a 90 degree angle, said second heat pipe is bent at a 90 degree angle, said third heat pipe is bent at a 90 degree angle, said fourth heat pipe is bent at a 90 degree angle, and said fifth heat pipe is bent at a 90 degree angle.

6. The illumination system of claim 1, further comprising:

a first thermally conductive substrate between said first array of light emitting diodes and said first heat pipe, wherein said first thermally conductive substrate is bonded to said first array of light emitting diodes and to a flat surface of said first heat pipe, wherein said first thermally conductive substrate conducts heat generated by said first array of light emitting diodes to said first heat pipe, and wherein said first thermally conductive substrate reflects light within said light recycling cavity;

a second thermally conductive substrate between said second array of light emitting diodes and said second heat pipe, wherein said second thermally conductive substrate is bonded to said second array of light emitting diodes and to a flat surface of said second heat pipe, wherein said second thermally conductive substrate conducts heat generated by said second array of light emitting diodes to said second heat pipe, and wherein said second thermally conductive substrate reflects light within said light recycling cavity;

a third thermally conductive substrate between said third array of light emitting diodes and said third heat pipe, wherein said third thermally conductive substrate is bonded to said third array of light emitting diodes and to a flat surface of said third heat pipe, wherein said third thermally conductive substrate conducts heat generated by said third array of light emitting diodes to said third heat pipe, and wherein said third thermally conductive substrate reflects light within said light recycling cavity;

a fourth thermally conductive substrate between said fourth array of light emitting diodes and said fourth heat pipe, wherein said fourth thermally conductive substrate is bonded to said fourth array of light emitting diodes and to a flat surface of said fourth heat pipe, wherein said fourth thermally conductive substrate conducts heat generated by said fourth array of light emitting diodes to said fourth heat pipe, and wherein said fourth thermally conductive substrate reflects light within said light recycling cavity; and a fifth thermally conductive substrate between said fifth array of light emitting diodes and said fifth heat pipe, wherein said fifth thermally conductive substrate is bonded to said fifth array of light emitting diodes and to a flat surface of said fifth heat pipe, wherein said fifth thermally conductive substrate conducts heat generated by said fifth array of light emitting diodes to said fifth heat pipe, and wherein said fifth thermally conductive substrate reflects light within said light recycling cavity.

7. The illuminations system of claim 6, wherein said first thermally conductive substrate is electrically conductive and said first heat pipe is electrically conductive for supplying power to said first array of light emitting diodes; said second thermally conductive substrate is electrically conductive and said second heat pipe is electrically conductive for supplying power to said second array of light emitting diodes; said third thermally conductive substrate is electrically conductive and said third heat pipe is electrically conductive for supplying power to said third array of light emitting diodes; and said fourth thermally conductive substrate is electrically conductive; said fourth heat pipe is electrically conductive for supplying power to said fourth array of light emitting diodes; and said fifth heat pipe is electrically conductive for supplying power to said fifth array of light emitting diodes.

* * * * *